US00RE47227E

(19) United States
(12) Reissued Patent
Ohgami

(10) Patent Number: US RE47,227 E
(45) Date of Reissued Patent: Feb. 5, 2019

(54) FORMING TRANSISTOR GATE STRUCTURES IN A SEMICONDUCTOR USING A MASK LAYER OVER AN INSULATING LAYER

(71) Applicant: PS4 Luxco S.a.r.l., Luxembourg (LU)

(72) Inventor: Takeshi Ohgami, Tokyo (JP)

(73) Assignee: LONGITUDE LICENSING LIMITED, Dublin (IE)

(21) Appl. No.: 14/791,185

(22) Filed: Jul. 2, 2015

Related U.S. Patent Documents

Reissue of:
(64) Patent No.: 8,477,536
Issued: Jul. 2, 2013
Appl. No.: 13/570,716
Filed: Aug. 9, 2012

U.S. Applications:
(63) Continuation of application No. 13/358,928, filed on Jan. 26, 2012, now Pat. No. 8,259,496, which is a continuation of application No. 12/696,627, filed on Jan. 29, 2010, now Pat. No. 8,130,546.

(30) Foreign Application Priority Data

Jan. 30, 2009 (JP) ..... 2009-019788

(51) Int. Cl.
*G11C 16/04* (2006.01)
*H01L 27/02* (2006.01)
*H01L 27/108* (2006.01)
*G11C 5/06* (2006.01)

(52) U.S. Cl.
CPC ..... *H01L 27/0207* (2013.01); *G11C 5/063* (2013.01); *H01L 27/10882* (2013.01); *H01L 27/10891* (2013.01); *H01L 27/10894* (2013.01); *H01L 27/10897* (2013.01)

(58) Field of Classification Search
CPC ..... G11C 5/063; H01L 27/0207; H01L 27/10897; H01L 27/10891; H01L 27/10894; H01L 27/10882
USPC ..... 365/185.05, 185.23, 63
See application file for complete search history.

(56) References Cited

U.S. PATENT DOCUMENTS

| | | | |
|---|---|---|---|
| 4,908,794 | A | 3/1990 | Yamaguchi |
| 5,053,841 | A | 10/1991 | Miyakawa et al. |
| 5,157,632 | A | 10/1992 | Tsutsui |
| 5,255,233 | A | 10/1993 | Izumi |
| 5,604,711 | A | 2/1997 | Cheung |
| 5,886,942 | A | 3/1999 | Akita |
| 5,982,689 | A | 11/1999 | Takahashi |
| 6,088,267 | A | 7/2000 | Atsumi et al. |

(Continued)

FOREIGN PATENT DOCUMENTS

| | | |
|---|---|---|
| JP | 2003007852 | 1/2003 |
| JP | 2006013506 | 1/2006 |
| JP | 2006-270126 | 10/2006 |

*Primary Examiner* — B. James Peikari
(74) *Attorney, Agent, or Firm* — Kunzler, PC

(57) ABSTRACT

A plurality of contact plugs to be connected to a drain region or a source region of each of transistors constituting a sub-word line driver that drives a sub-word line are formed, by using a SAC line technique of selectively etching an insulation layer that covers each of the transistors by using a mask having line-shaped openings provided across a portion in which the contact plugs of each of the transistors are to be formed.

12 Claims, 21 Drawing Sheets

(56) References Cited

U.S. PATENT DOCUMENTS

| | | | | |
|---|---|---|---|---|
| 6,259,135 | B1 | 7/2001 | Hsu et al. | |
| 6,780,705 | B2 * | 8/2004 | Yasuda | 438/239 |
| 6,821,856 | B2 * | 11/2004 | Takagi | 438/294 |
| 6,845,042 | B2 * | 1/2005 | Ichige et al. | 365/185.17 |
| 7,016,214 | B2 | 3/2006 | Kawamata et al. | |
| 7,054,219 | B1 | 5/2006 | Petti et al. | |
| 7,078,334 | B1 * | 7/2006 | Chowdhury | H01L 21/02063 216/41 |
| 7,141,474 | B2 * | 11/2006 | Ichige et al. | 438/257 |
| 7,486,553 | B2 * | 2/2009 | Motoi et al. | 365/180 |
| 7,563,713 | B2 * | 7/2009 | Rowell | H01L 21/76879 438/674 |
| 7,566,659 | B2 * | 7/2009 | Bai | H01L 21/0331 257/E21.587 |
| 7,570,525 | B2 | 8/2009 | Nii et al. | |
| 7,672,164 | B2 * | 3/2010 | Hasegawa et al. | 365/185.11 |
| 2011/0157978 | A1 | 6/2011 | Shinozaki et al. | |
| 2011/0210339 | A1 | 9/2011 | Yamazaki | |

* cited by examiner

FORMING TRANSISTOR GATE STRUCTURES IN A SEMICONDUCTOR USING A MASK LAYER OVER AN INSULATING LAYER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

This application is a continuation of co-pending application Ser. No. 13/358,928 filed on Jan. 26, 2012, which is a continuation of application Ser. No. 12/696,627 filed on Jan. 29, 2010, which claims foreign priority to Japanese patent application No. 2009-019788 filed on Jan. 30, 2009. The entire content of each of these applications is hereby expressly incorporated by reference.

BACKGROUND OF THE INVENTION

1. Field of the Invention

The present invention relates to a semiconductor memory device and a manufacturing method of a semiconductor memory device, and more particularly relates to a semiconductor memory device including a select-line driving circuit for driving a select line and a manufacturing method of the semiconductor memory device.

2. Description of Related Art

In general, a DRAM (Dynamic Random Access Memory) has a hierarchical word line structure. Japanese Patent Application [Laid-open] *Publication* No. 2006-270126 discloses an example of a DRAM configured by [hierarchial] *hierarchical* word lines.

When [hierarchial] *hierarchical* word lines are used, the word lines are hierarchized into main word lines that become high-order word lines and sub-word lines that become low-order word lines. Each sub-word line is connected to a main word line by a sub-word line driving circuit, and when a main word line driving circuit and the sub-word line driving circuit are activated based on a row address input from outside, a corresponding sub-word line is also activated.

Because many memory cells are connected to the sub-word lines, a transistor constituting the sub-word line driving circuit is required to have a relatively high driving capacity. Therefore, a current driving capacity needs to be secured by increasing a gate width of each transistor to some extent.

To secure a sufficient gate width, conventionally, an installation area of a sub-word line driving circuit [takes] *uses* a large length in [an extending] *a lateral* direction (a row direction) of sub-word lines. This is because sub-word line driving circuits are arranged along a layout direction (a column direction) of the sub-word lines, there is no room for a large length of the installation area of the sub-word line driving circuits in the layout direction of the sub-word lines.

However, when the installation area of the sub-word line driving circuits is long in the row direction, the entire size of the DRAM naturally becomes large. Therefore, it has been required to further decrease a size of the installation area in the row direction without degrading the performance of the sub-word line driving circuits.

Contact plugs that connect source/drain regions of each of transistors constituting the sub-word line driving circuit and the sub-word lines are formed by using a technique called a SAC (Self Aligned Contact) hole technique. According to this technique, an upper surface and a side surface of a gate electrode are first covered with a gate gap and a sidewall made of a silicon nitride film. The entire sense amplifier is covered on this with a silicon oxide film. The silicon oxide film is selectively etched by using a mask, thereby providing holes on the source/drain regions. Last, a conductive layer is embedded into the contact holes, thereby forming the contact plugs in self alignment.

The SAC hole technique has this name because a mask used for the above selective etching has holes for respective contacts.

However, the above technique has a problem in that a distance between a contact plug and a gate electrode becomes long. That is, because contact holes are very narrow holes, it takes some time before sufficient holes are formed. This is because it takes time for etchant to move in narrow holes. Accordingly, to prevent gate electrodes from being damaged, a gate gap and a sidewall need to have a large thickness to some extent. Consequently, a distance between a contact plug and a gate electrode [becomes long] *increases* corresponding to the large thickness.

When a distance between a contact plug and a gate electrode can be reduced, the inside of the sub-word line driving circuit can have high density, and a size of an installation area of the sub-word line driving circuit in the row direction can be reduced without degrading the performance of the sub-word line driving circuit.

The same can be also applied to other types of [circuit that drives] *circuits that drive* select lines (word lines are also one type of select lines) such as a column decoder that drives column select lines, not only to the sub-word line driving circuits.

SUMMARY

In one embodiment, there is provided a manufacturing method of a semiconductor memory device including select-line driving circuits that drives select lines, each of the select-line driving circuits including a plurality of transistors having source/drain regions, the method comprising:

forming a mask having a line-shaped opening provided across the source/drain regions of each of the transistors; and forming a plurality of contact plugs each electrically connected to an associated one of the source/drain regions by using a SAC line technique of selectively etching an insulation layer that covers each of the transistors by using the mask.

In another embodiment, there is provided a manufacturing method of a semiconductor memory device comprising: forming a plurality of gate structures along an active region each included in an associated one of transistors that drives a plurality of word lines to which memory cells are connected, each of the gate structures having an upper surface and aside surface covered with an insulation film; covering the active region and the gate structures by an interlayer insulation layer; forming a mask layer on the interlayer insulation layer, the mask layer having line-shaped openings across a portion where a plurality of contact holes to expose a source region and a drain region of each of the transistors are to be formed; forming the plurality of contact holes by selectively removing the interlayer insulation layer by using the mask layer and the insulation layer as a mask; and forming contact plugs within the contact holes.

In still another embodiment, there is provided a semiconductor memory device comprising: a plurality of select lines each elongating in a first direction, the select lines being arranged at a pitch P [in] substantially parallel to each other in a second direction crossing the first direction; and a plurality of gate pattern sets, each of the gate pattern sets including at least two gate electrode patterns, the gate electrode pattern sets being arranged in line in the first direction, the at least two gate electrode patterns being arranged in line in the second direction; each of the gate pattern sets having a length in the second direction that is equal to or smaller than six times of the pitch P; each of the gate electrode patterns in each of the gate patterns serving as gates of a plurality of transistors constituting two select-line driving circuits.

In still another embodiment, there is provided a semiconductor memory device comprising: a plurality of word lines each extending in a first direction, a pitch of the word lines in a memory-cell array region is P; and a plurality pair of gate electrode patterns arranged in the first direction, wherein each pair of gate electrode patterns being extended to the first direction in parallel, a length of each pair of gate electrode patterns in a second direction substantially perpendicular to the first direction is equal to or less than 6×P, each of the gate electrode patterns [are serves] *serve* as a first gate electrode of a transistor included in a first word-line driving circuit that drives one of the word lines and a second gate electrode of another transistor included in a second word-line driving circuit that drives other one of the word lines.

In still another embodiment, there is provided a semiconductor memory device comprising: a signal line pattern including a plurality of signal lines and having a pitch defined by a line and a space, each of the signal lines being elongated in a first direction, the signal lines being arranged in substantially parallel to each other in a second direction crossing the first direction; and a transistor pattern disposed adjacently to the signal line pattern, the transistor pattern including an active region, at least four gate electrodes overlaying the active region with an intervention of gate insulating films, and source and drain regions formed in the active region, the at least four gate electrodes being arranged in substantially parallel to each other in the second direction and elongated in the first direction, and the active region having a length in the second direction that is six times as large as the pitch.

According to the present invention, openings of a mask are provided in a line shape across plural contact plugs. Therefore, [et chant] *etchant* can efficiently move within contact holes, as compared with holes formed by the SAC hole technique. Accordingly, a distance between a contact hole and a gate electrode can be reduced.

DETAILED DESCRIPTION OF THE EMBODIMENTS

The above features and advantages of the present invention will be more apparent from the following description of certain preferred embodiments taken in conjunction with the accompanying drawings, in which.

DETAILED DESCRIPTION OF THE PREFERRED EMBODIMENTS

Preferred embodiments of the present invention will be explained below in detail with reference to the accompanying drawings.

Figure 1:
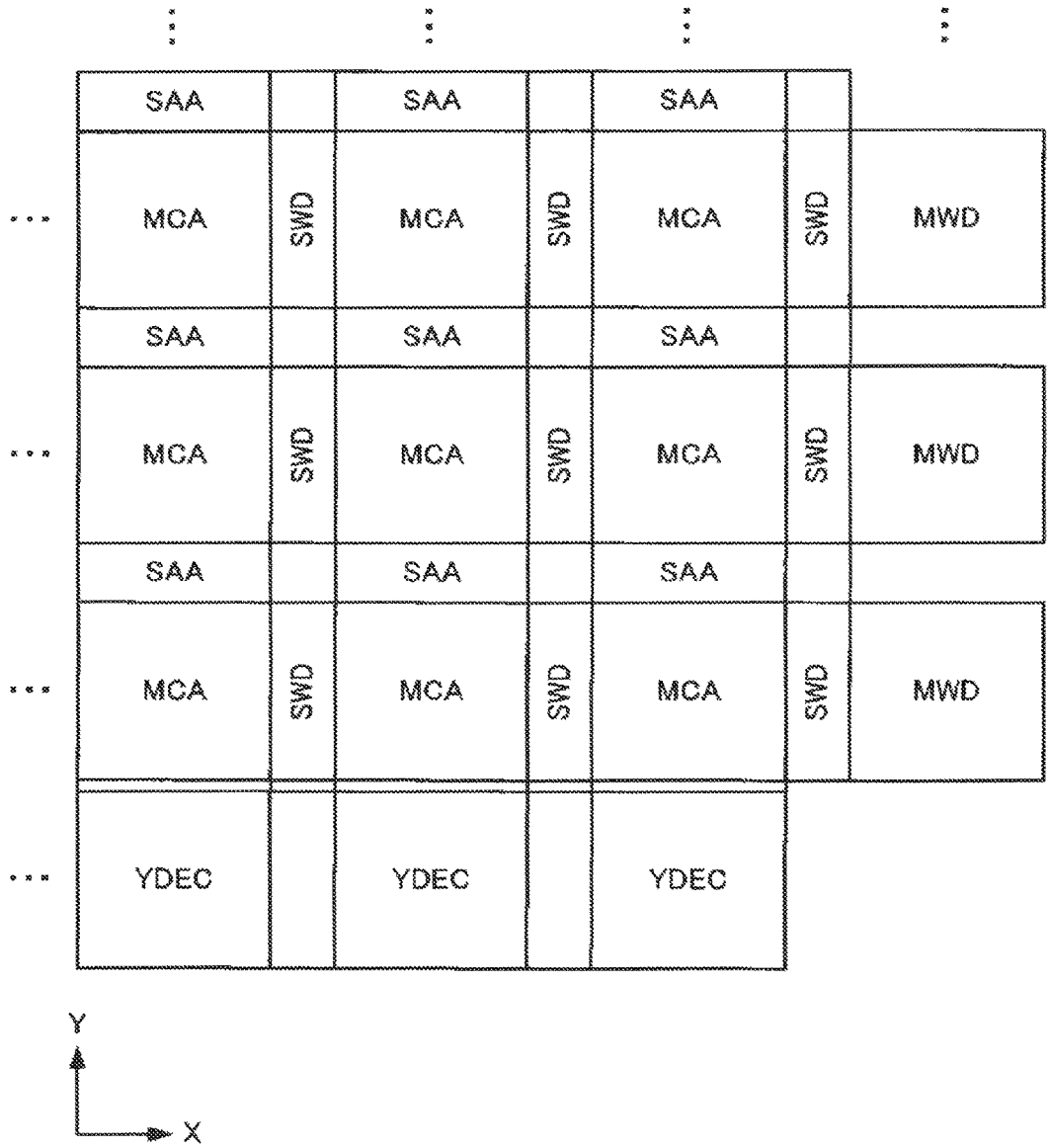
FIG. 1 shows a configuration of a semiconductor memory device according to an embodiment of the present invention.

FIG. 1 shows a configuration of a semiconductor memory device according to an embodiment of the present invention. This semiconductor memory device is a DRAM, and only a part of a configuration within a memory mat of the DRAM is shown in FIG. 1.

As shown in FIG. 1, the semiconductor memory device according to the present embodiment has plural memory cell areas MCA arranged in a matrix shape. Sub-word areas SWD are provided between the memory cell areas MCA adjacent in an X direction. The sub-word areas SWD are also provided at outside of the memory cell areas MCA positioned at the furthest end, and main word areas MWD are further provided at outside of the sub-word lines SWD. Sense amplifier areas SAA are provided between the memory cell areas MCA adjacent in a Y direction. Column decoders YDEC are provided at outside of the memory cell areas MCA positioned at the furthest end. The X direction is an extending direction of the sub-word lines SWL, and coincides with a longitudinal direction of the sense amplifier areas SAA. The Y direction is an extending direction of the bit lines BL, and coincides with a longitudinal direction of the sub-word areas SWD.

Figure 2:
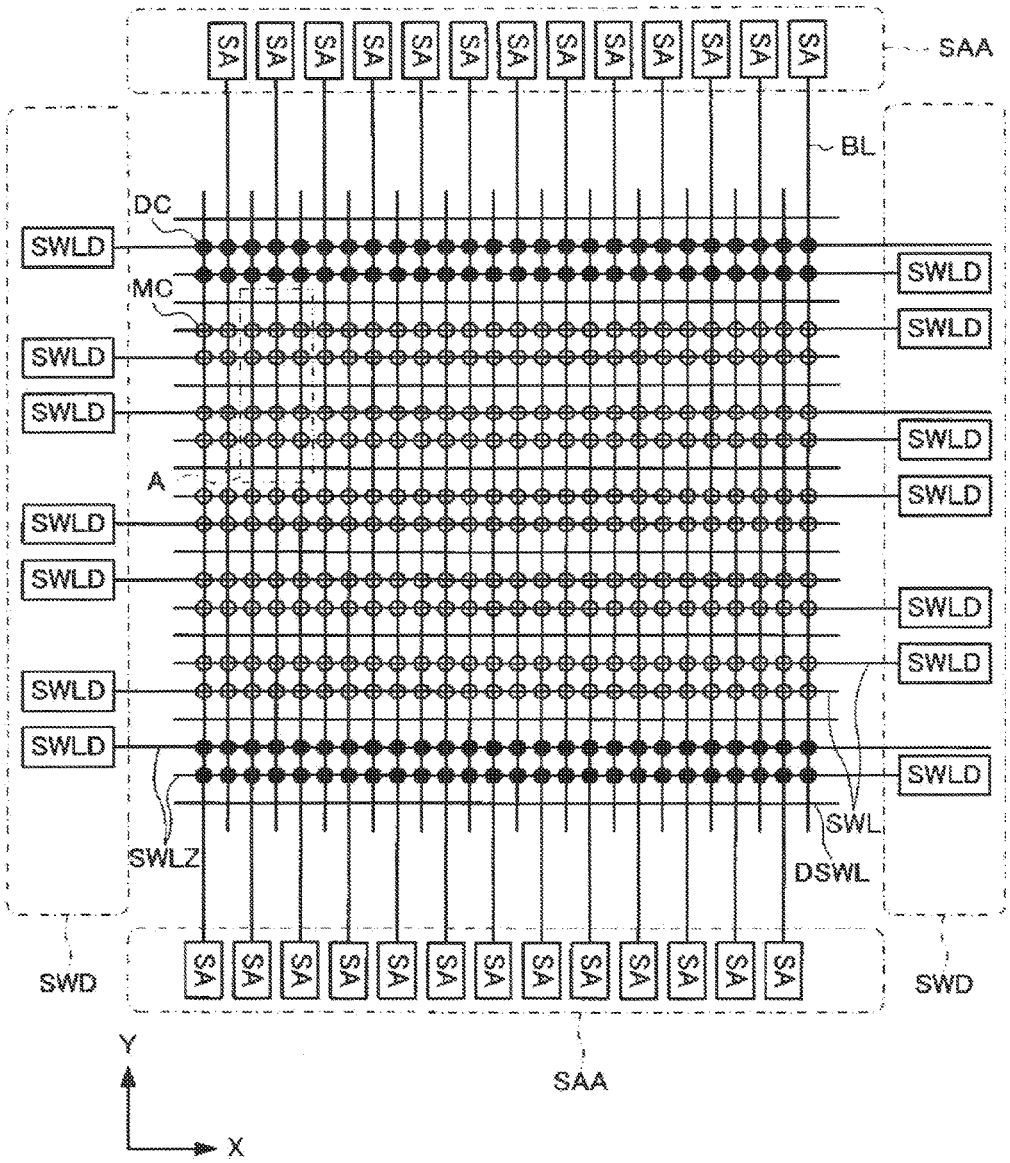
FIG. 2 shows a circuit configuration of the memory cell area according to an embodiment of the present invention.

FIG. 2 shows a circuit configuration of the memory cell area. As shown in FIG. 2, the memory cell area MCA includes: plural sub-word lines SWL arranged in the X direction; plural bit lines BL arranged in the Y direction; and memory cells MC arranged at each intersection of the sub-word line SWL and the bit line BL. Numbers of the sub-word lines SWL and the bit lines BL shown in FIG. 2 are only exemplary, and the present invention is not particularly limited thereto.

Each sub-word line SWL is connected, at every other line, to each sub-word line driver (sub-word line driving circuit) SWLD within the sub-word area SWD arranged at one side in the X direction, and to each sub-word line driver SWLD within the sub-word area SWD arranged at the other side in the X direction.

Several sub-word lines SWL positioned at both ends of the Y direction are not used, and these become unused sub-word lines SWLZ. This is because process conditions at a manufacturing time are slightly different between the end and the center of the memory cell areas MCA, and defective cells easily occur at the ends of the memory cell area MCA. Therefore, memory cells connected to these unused sub-word lines SWLZ are handled as dummy cells DC. Because the unused sub-word lines SWLZ are fixed in a deactive state, the dummy cells DC are not connected to the bit lines BL.

The dummy sub-word lines DSWL are arranged at every three sub-word lines SWL, in the memory cell area MCA. That is, a unit configuration of two sub-word lines SWL and one dummy sub-word line DSWL is repeatedly arranged in the Y direction. Neither a memory cell MC nor a dummy cell DC is arranged at an intersection of the dummy sub-word line DSWL and the bit line BL. That is, the dummy sub-word lines DSWL are dummy wirings basically not contributing to the actual operation. These dummy sub-word lines DSWL are provided because a layout having $6F^2$ as an occupied area of the memory cells MC is employed when a minimum process size or minimum feature size (minimum process dimension) is F. This arrangement is explained in detail below.

Figure 3:
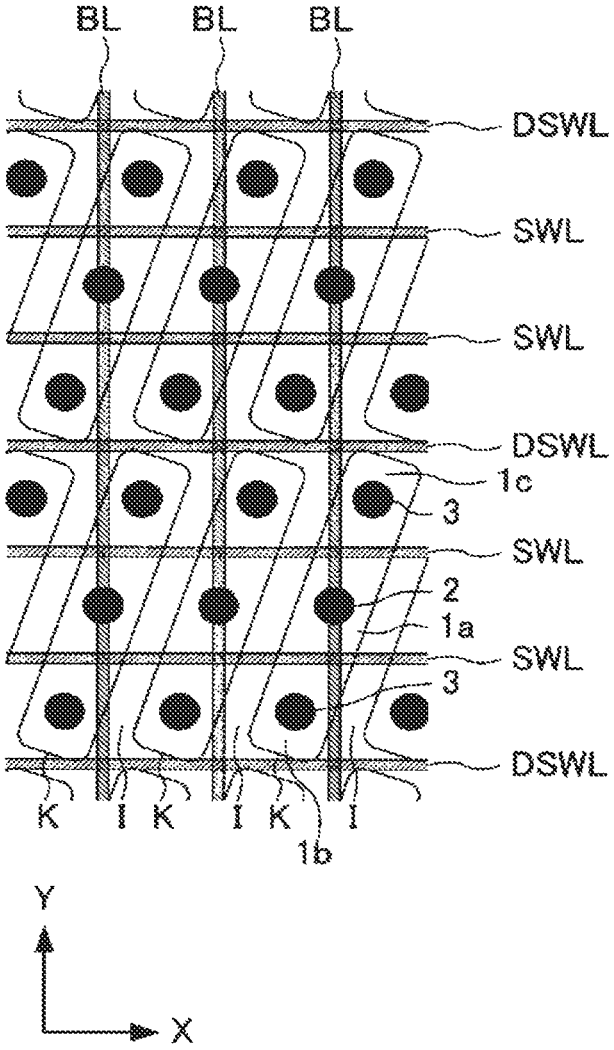
FIG. 3 shows a layout of an active region K within the memory cell area according to an embodiment of the present invention, and shows an enlarged view of an area A shown in FIG. 2.

FIG. 3 shows a layout of an active region K within the memory cell area MCA, and shows an enlarged view of an area A shown in FIG. 2. An insulation layer is embedded into regions other than the active region K following the STI (Shallow Trench Isolation) method, thereby configuring an insulation dielectric region I.

As shown in FIG. 3, a plane shape of the active region K is approximately rectangular. The active region K has a slight angle in a longitudinal direction relative to the Y direction. The active regions K are arranged in rows along the X direction. Based on this configuration, two adjacent sub-word lines SWL pass always on the same active region.

One active region K includes two memory cells MC. When an occupied area of one memory cell MC is $6F^2$, lengths of the active region K in the X and Y directions are about 2F and about 6F, respectively. A detailed configuration of the active region K is explained below. The active region K has three diffusion regions 1a to 1c, and the diffusion region 1a positioned at the center is connected to a corresponding bit line BL via a bit contact 2. The diffusion regions 1b and 1c positioned at both ends are connected to corresponding cell capacitors (not shown) via cell contacts 3. Each one sub-word line SWL passes on an upper part between the diffusion region 1a and the diffusion regions 1b and 1c, respectively. Accordingly, the two adjacent diffusion regions and the sub-word line SWL between these two diffusion regions constitute a cell transistor of the memory cells MC, and one active region K includes two memory cells MC.

A distance between the sub-word lines SWL each passing between the diffusion region 1a and the diffusion region 1b and between the diffusion region 1a and the diffusion region 1c, respectively, is 2F. On the other hand, a minimum distance between the sub-word lines SWL between the active regions K adjacent in the Y direction is 4F, because the length of the active region K in the Y direction is about 6F as described above. Therefore, a distance between the sub-word lines SWL within the active region K is different from a distance between the sub-word lines SWL between the active regions K. To secure a satisfactory process condition, it is preferable that wiring density of the sub-word lines SWL is set constant. In the present embodiment, to set constant the wiring density of the sub-word lines SWL, the dummy sub-word line DSWL is arranged at every three sub-word lines SWL.

The bit lines BL are connected, at every other line, to each sense amplifier SA within the sense amplifier area SAA arranged at one side in the Y direction and to each sense amplifier SA within the sense amplifier area SAA arranged at the other side in the Y direction (an open bit line system).

Each sense amplifier SA is a circuit used to amplify a potential difference between the bit lines BL, and is connected to a pair of bit lines BL extended to the Y direction with the memory cell areas MCA adjacent in the Y direction. More specifically, each sense amplifier SA is connected to a pair of bit lines BL extended respectively to the inside of two memory cell areas MCA adjacent in mutually different directions from the viewpoint of the sense amplifier SA.

Figure 4:
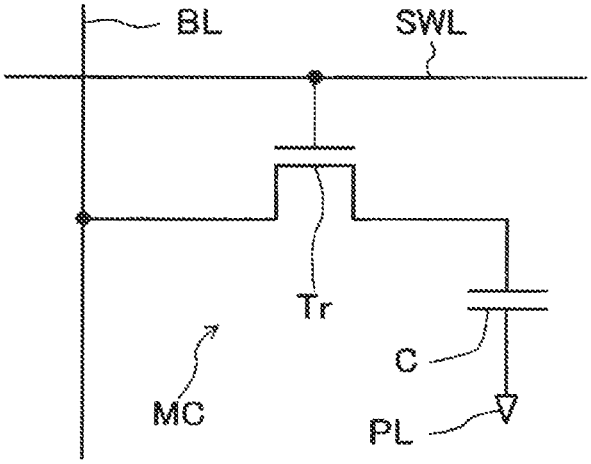
FIG. 4 shows a circuit configuration of the memory cell according to an embodiment of the present invention.

An operation of a semiconductor memory device is explained below while explaining an internal configuration of the memory cell MC. As shown in FIG. 2, many (256K, for example) memory cells MC are arranged in the memory cell area MCA. As shown in FIG. 4, each memory cell MC includes a cell transistor Tr and a cell capacitor C connected in series between the bit line BL and a plate wiring PL. Agate electrode of the cell transistor Tr is connected to a corresponding sub-word line SWL. Accordingly, when the sub-word line SWL becomes at a high level, a corresponding cell transistor Tr becomes on, and the cell capacitor C is connected to a corresponding bit line BL.

First, the sub-word line driver SWLD selected corresponding to a row address input from outside activates a corresponding sub-word line SWL. The cell transistor Tr is then turned on within many memory cells MC connected to the sub-word line SWL, and becomes a selected state (a readable and writable state). That is, the sub-word line SWL is a select line to select the memory cell MC.

In writing data into the memory cell MC, a high-order writing potential VARY (1.4 V, for example) or a low-order writing potential VSSA (0 V, for example) is supplied to the cell capacitor C through the bit line BL corresponding to data to be stored.

Meanwhile, in reading data from the memory cell MC, the bit line BL is precharged at an intermediate potential, that is, (VARY-VSSA)/2 (0.7V, for example, and hereinafter simply referred to as "VARY/2"), and thereafter, the cell transistor Tr is turned on. Accordingly, when the high-order writing potential VARY is written in advance in the cell capacitor C, a potential of the bit line BL slightly increases from the intermediate potential. When the low-order writing potential VSSA is written in advance in the cell capacitor C, a potential of the bit line BL slightly decreases from the intermediate potential.

As explained above, in accessing the memory cell MC, the sub-word line driver SWLD first drives the sub-word line SWL. The semiconductor memory device according to the present embodiment has a characteristic in the sub-word line driver SWLD and the manufacturing method thereof. Therefore, configurations of the sub-word line driver SWLD and peripheral circuit thereof are explained first, and a manufacturing method of the sub-word line driver SWLD is explained next.

Figure 5:
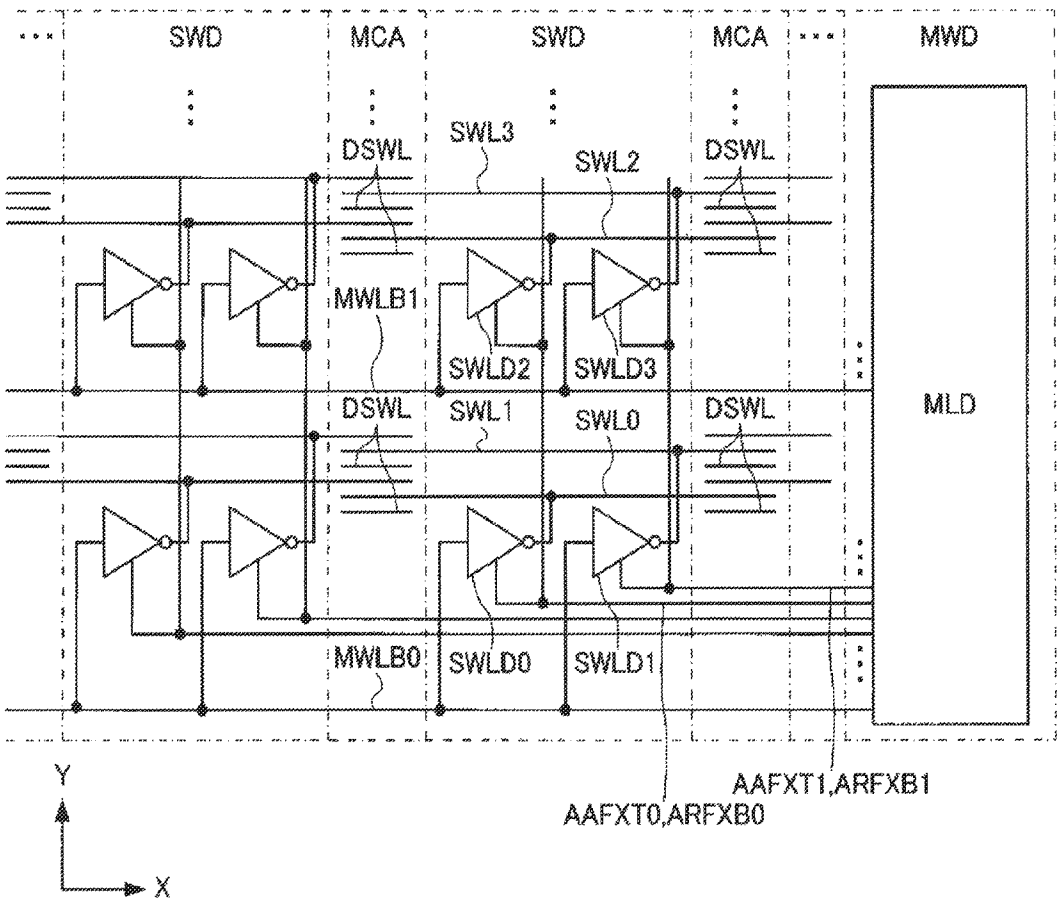
FIG. 5 shows a detailed circuit configuration of the semiconductor memory device shown in FIG. 1.

FIG. 5 shows a detailed circuit configuration of the semiconductor memory device shown in FIG. 1. As shown in FIG. 1, a main word line driver MLD is provided in a main word area MWD. The main word line driver MLD is connected to a main word line MWLB, a sub-word-line select signal line AAFXT, and a word-line float-prevention signal line ARFXB provided in the X direction, respectively. Letters "B" and "T" attached to the end of each symbol of each line represent low active and high active, respectively.

Within each sub-word area SWD, two sub-word line drivers SWLD are provided per one main word line MWLB. Each sub-word line driver SWLD is connected to one main word line MWLB, one sub-word line SWL, one sub-word-line select signal line AAFXT, and one word-line float-prevention signal line ARFXB, respectively.

One specific example is taken from FIG. 5. Within the sub-word area SWD at the center in FIG. 5, sub-word line drivers SWLD0 and SWLD1 are provided for a main word line MWLB0. The sub-word line driver SWLD0 is connected to the main word line MWLB0, a sub-word line SWL0, a sub-word-line select signal line AAFXT0, and a word-line float-prevention signal line ARFXB0, respectively. The sub-word line driver SWLD1 is connected to the main word line MWLB0, a sub-word line SWL1, a sub-word-line select signal line AAFXT1, and a word-line float-prevention signal line ARFXB1, respectively.

Similarly, sub-word line drivers SWLD2 and SWLD3 are provided for a main word line MWLB1. The sub-word line driver SWLD2 is connected to the main word line MWLB1, a sub-word line SWL2, the sub-word-line select signal line AAFXT0, and the word-line float-prevention signal line ARFXB0, respectively. The sub-word line driver SWLD3 is connected to the main word line MWLB1, a sub-word line SWL3, the sub-word-line select signal line AAFXT1, and the word-line float-prevention signal line ARFXB1, respectively.

Each sub-word line SWL provided within the sub-word area SWD is connected to the sub-word lines SWL within two memory cell areas MCA adjacent to the sub-word area SWD.

The main word line MWLB and the sub-word line SWL constitute the hierarchical word line described above. That is, the main word line driver MLD activates a corresponding main word line MWLB and a corresponding sub-word-line select signal line AAFXT, according to a row address signal input from outside. Consequently, the sub-word line driver SWLD connected to both activated lines activates a corresponding sub-word line SWL. By employing the hierarchical word line, the number of memory cells MC selected at one time can be reduced as compared with the number of selected memory cells when the main word line MWLB is directly connected to each memory cell MC.

Figure 6:
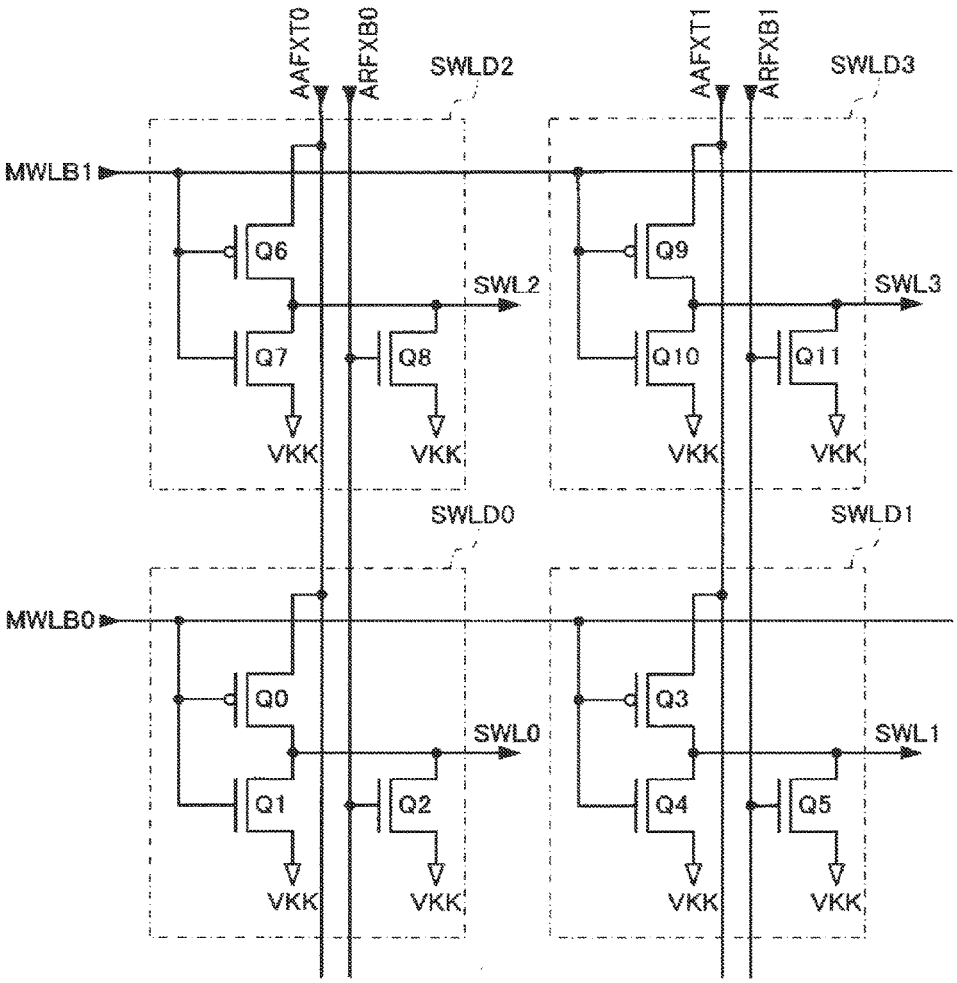
FIG. 6 shows internal circuits of the sub-word line drivers shown in FIG. 5.

FIG. 6 shows internal circuits of the sub-word line drivers SWLD0 to SWLD3 shown in FIG. 5. As shown in FIG. 6, the sub-word line driver SWLD0 has a P-channel MOS transistor Q0, and N-channel MOS transistors Q1 and Q2. Gates of the transistors Q0 and Q1 are connected to the main word line MWLB0. Drains of the transistors Q0, Q1, and Q2 are connected to the sub-word line SWL0. A source of the transistor Q0 is connected to the sub-word-line select signal line AAFXT0. A potential VKK (ground potential) is supplied to sources of the transistors Q1 and Q2. Other sub-word line drivers SWLD1 to SWLD3 are also similar to the above, except a difference of symbols of transistors and connection lines.

An operation of the sub-word line driver SWLD is explained with reference to FIG. 6.

First, the main word line driver MLD (see FIG. 5) determines the sub-word line SWL to be selected, according to a row address signal input from outside. The main word line driver MLD activates a corresponding main word line MWLB and a corresponding sub-word-line select signal line AAFXT, according to the determined sub-word line SWL. Explanations are continued below while assuming that the sub-word line driver SWLD0 is selected. In this case, the main word line driver MLD activates the main word line MWLB0 and the sub-word-line select signal line AAFXT0, and deactivates other main word lines MWLB and other sub-word-line select signal lines AAFXT.

Because the main word line MWLB is low active, a low signal is input to each gate of the transistors Q0, Q1, Q3, and Q4 connected to the main word line MWLB0 in an activated state. Therefore, the P-channel MOS transistors Q0 and Q3 are turned on, and the N-channel MOS transistors Q1 and Q4 are turned off. Accordingly, the sub-word lines SWL0 and SWL1 are connected to the sub-word-line select signal lines AAFXT0 and AAFXT1, respectively. Because the sub-word-line select signal line AAFXT is high active, the activated sub-word-line select signal line AAFXT0 becomes a high state, and the non-activated sub-word-line select signal line AAFXT1 is in a low state. Therefore, the sub-word line SWL0 becomes a selected state (a state that the cell transistor connected to the sub-word line SWL0 is on), and the sub-word line SWL1 becomes a non-selected state (a state that the cell transistor connected to the sub-word line SWL1 is off).

On the other hand, a high signal is input to each gate of the transistors Q6, Q7, Q9, and Q10 connected to the main word line MWLB1 in the non-activated state. Therefore, the N-channel MOS transistors Q7 and Q10 are turned on, and the P-channel MOS transistors Q6 and Q9 are turned off. Accordingly, the potential VKK is supplied to the sub-word lines SWL2 and SWL3, and these sub-word lines become in the non-selected state.

The word-line float-prevention signal line ARFXB is used to prevent a potential float of the sub-word lines SWL in the non-selected state. That is, when the word-line float-prevention signal line ARFXB0 is not activated, for example, the transistors Q2 and Q8 become in the on state, and the potential VKK is supplied to the sub-word lines SWL0 and SWL2 via the transistors Q2 and Q8. Accordingly, potentials of the sub-word lines SWL0 and SWL2 are more securely fixed to the potential VKK. Because the word-line float-prevention signal line ARFXB is used to prevent a potential float of the sub-word lines SWL in this way, transistors having a smaller driving capacity than that of other transistors can be used for the transistors Q2, Q5, Q8, and Q11 connected to the word-line float-prevention signal line ARFXB.

A configuration of the transistor constituting the sub-word line driver SWLD is explained next.

Figure 7:
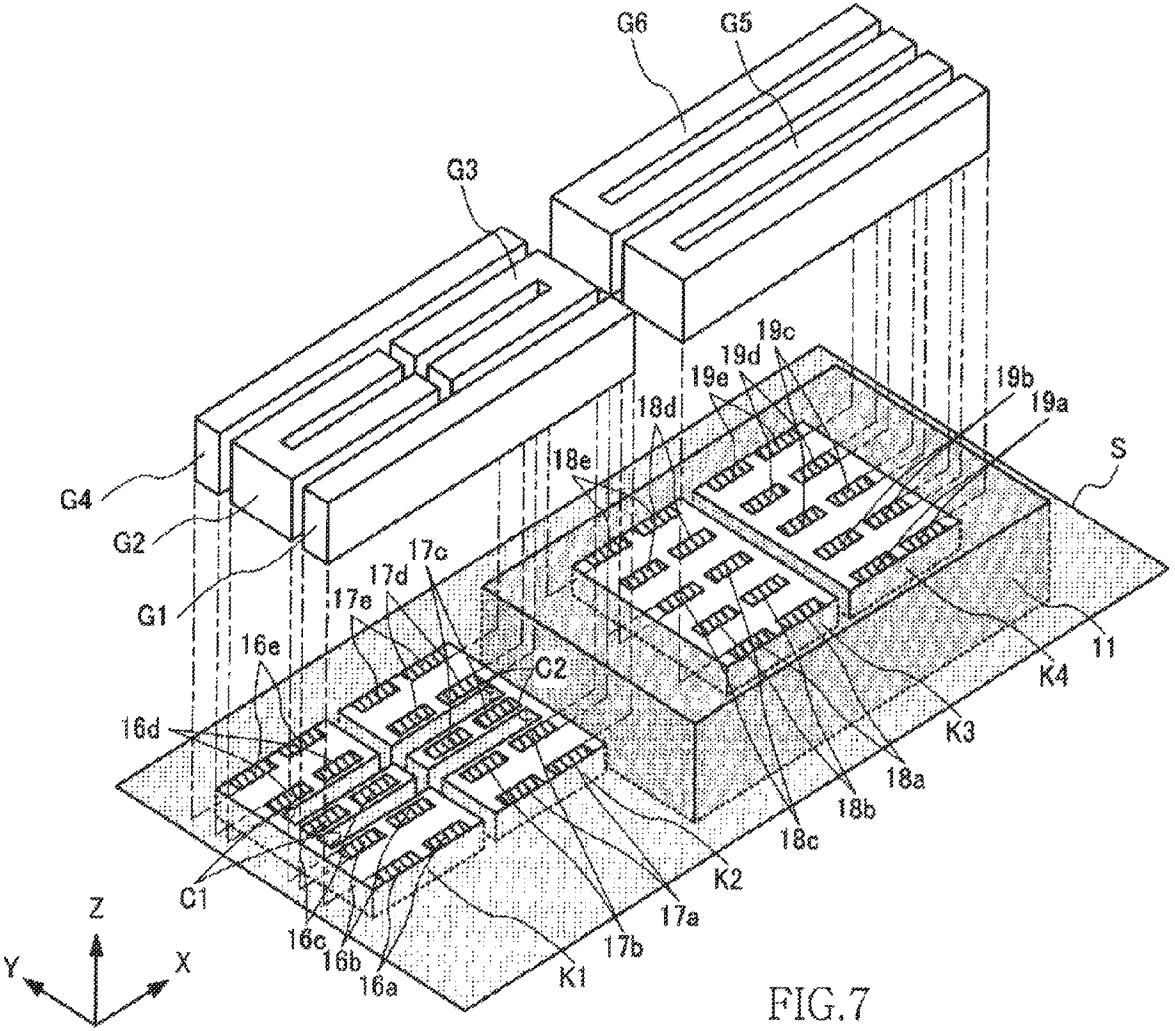
FIG. 7 shows a three-dimensional configuration of the sub-word line driver according to an embodiment of the present invention.

FIG. 7 shows a three-dimensional configuration of the sub-word line driver SWLD. FIG. 7 shows a three-dimensional configuration of transistors constituting the sub-word line drivers SWLD0 to SWLD4 shown in FIG. 6. In FIG. 7, a plane S represents a surface of a P-type semiconductor substrate on which the sub-word line drivers SWLD0 to SWLD4 are provided.

As shown in FIG. 7, an N-type region (NWELL) 11 is provided on the surface S of the P-type semiconductor substrate. Four active regions K1 to K4 are arranged in the X direction. The active regions K1 and K2 are positioned at outside of the N-type region 11, and the active regions K3 and K4 are positioned within the N-type region 11. These active regions K1 to K4 are partitioned by an insulation layer (a dielectric isolation region) embedded in the surface S of the P-type semiconductor substrate, in a similar manner to that of the active region K within the memory cell area MCA. FIG. 7 omits this insulation layer.

In the active region K1, two rows of n+ diffusion layers made of five n+ diffusion layers 16a to 16e arranged at equal intervals along the Y direction are arranged. Similarly, in the active region K2, two rows of n+ diffusion layers made of five n+ diffusion layers 17a to 17e arranged at equal intervals along the Y direction are arranged. In the active region K3, two rows of p+ diffusion layers made of five p+ diffusion layers 18a to 18e arranged at equal intervals along the Y direction are arranged. In the active region K4, two rows of p+ diffusion layers made of five p+ diffusion layers 19a to 19e arranged at equal intervals along the Y direction are arranged.

On the surface S of the P-type semiconductor substrate, gate electrode structures G1 to G6 made of a conductive layer and an insulation layer are provided (an internal configuration of the gate electrode structure is described in detail later). In FIG. 7, while the gate electrode structures G1 to G6 are isolated from the surface S to facilitate the understanding of a structure of the surface S, the gate electrode structures G1 to G6 are actually contacted to the surface S via a gate dielectric film.

The gate electrode structure G1 has a rectangular plane having a longitudinal direction in the X direction, and is arranged between the n+ diffusion layers 16a and 17a and the n+ diffusion layers 16b and 17b. Both ends of the gate electrode structure G1 in the longitudinal direction are extended to above the dielectric isolation region.

The gate electrode structure G2 has a U-shaped plane having a longitudinal direction in the X direction. One of two straight line portions extended to the X direction is arranged between the n+ diffusion layer 16b and the n+ diffusion layer 16c, and the other straight line portion is arranged between the n+ diffusion layer 16c and the n+ diffusion layer 16d. A portion extended to the Y direction is partly extended to above the dielectric isolation region.

The gate electrode structure G3 has a U-shaped plane having a longitudinal direction in the X direction. One of two straight line portions extended to the X direction is arranged between the n+ diffusion layer 17b and the n+ diffusion layer 17c, and the other straight line portion is arranged between the n+ diffusion layer 17c and the n+ diffusion layer 17d. A portion extended to the Y direction is partly extended to above the dielectric isolation region.

As shown in FIG. 7, the active regions K1 and K2 have cuts C1 and C2 immediately below two straight line portions extended to the X direction of the gate electrode structures G2 and G3. These cuts are provided to substantially shorten a channel width when the gate electrode structures G2 and G3 function as gate electrodes of transistors.

The gate electrode structure G4 has a rectangular plane having a longitudinal direction in the X direction, and is arranged between the n+ diffusion layers 16d and 17d and the n+ diffusion layers 16e and 17e. Both ends of the gate electrode structure G4 in the longitudinal direction are extended to above the dielectric isolation region.

The gate electrode structure G5 has a U-shaped plane having a longitudinal direction in the X direction. One of two straight line portions extended to the X direction is arranged between the p+ diffusion layers 18a and 19b and the p+ diffusion layers 18b and 19b, and the other straight line portion is arranged between the p+ diffusion layers 18b and 19b and the p+ diffusion layers 18c and 19c. A part of a portion extended to the Y direction, and each open end of two straight line portions extended to the X direction are extended to above the dielectric isolation region.

The gate electrode structure G6 has a U-shaped plane having a longitudinal direction in the X direction. One of two straight line portions extended to the X direction is arranged between the p+ diffusion layers 18c and 19c and the p+ diffusion layers 18d and 19d, and the other straight line portion is arranged between the p+ diffusion layers 18d and 19d and the p+ diffusion layers 18e and 19e. A part of a portion extended to the Y direction, and each open end of two straight line portions extended to the X direction are extended to above the dielectric isolation region.

Figure 8A:
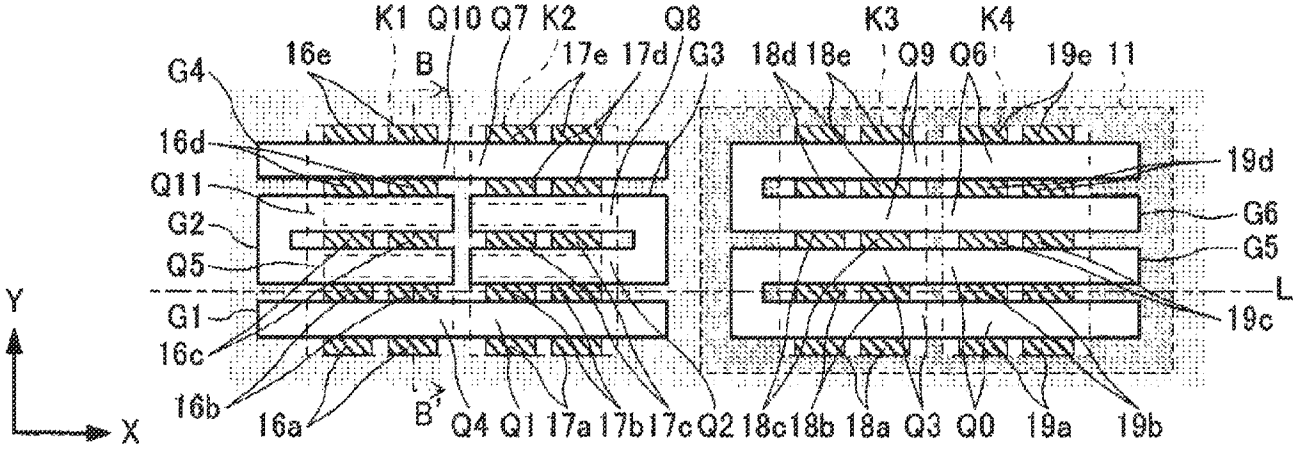
FIG. 8A shows a plane pattern layout of the sub-word area according to an embodiment of the present invention.

FIG. 8A shows a plane pattern layout of the sub-word area SWD. The plane pattern in FIG. 8A corresponds to a configuration shown in FIG. 7 viewed from the above. In FIG. 8A, a boundary line (a dashed line) of the active region is drawn above the gate electrode structure to facilitate the understanding of a relationship between the gate electrode structure and the active region.

Figure 9A:
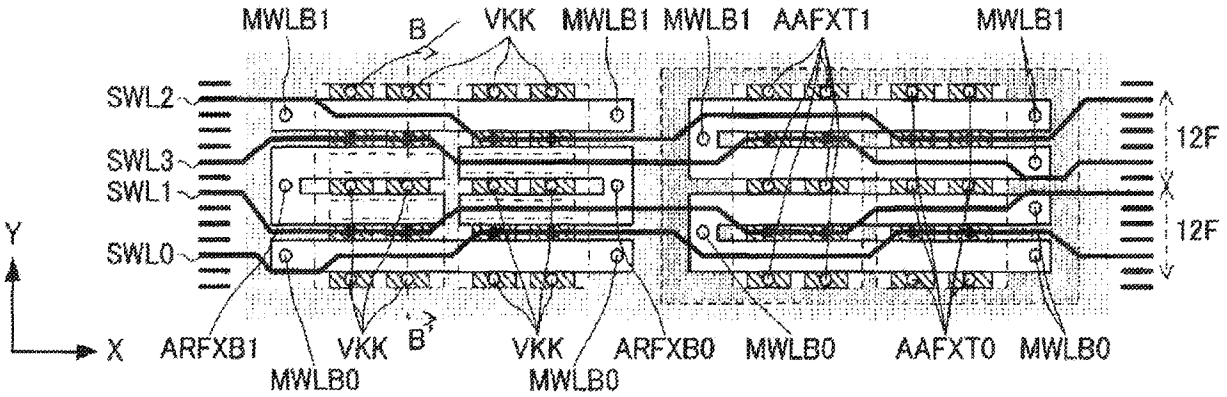
FIG. 9A shows a wiring layout of the sub-word lines connected to the sub-word line drivers, on the plane pattern layout of the sub-word area shown in FIG. 8A.

FIG. 9A shows a wiring layout of the sub-word lines SWL0 to SWL3 connected to the sub-word line drivers SWLD0 to SWLD3, on the plane pattern layout of the sub-word area SWD shown in FIG. 8A. In FIG. 9A, black circle marks provided in the sub-word lines SWL denote parts where a diffusion layer is electrically in contact with the sub-word line SWL. For each of the main word line MWLB, the sub-word-line select signal line AAFXT, and the word-line float-prevention signal line ARFXB, only a contact point with a diffusion layer or with a gate electrode structure is shown by a hollow round mark.

Relationships between the transistors Q1 to Q12, the gate electrode structures G1 to G6, the n+ diffusion layers, and the p+ diffusion layers shown in FIG. 6 are explained below with reference to FIG. 8A and FIG. 9A. Thereafter, a plane pattern layout of the sub-word area SWD is explained in detail.

First, the active regions K1 and K2 are mainly explained. The gate electrode pattern G1 (a plane pattern corresponding to the gate electrode structure G1; and this applies to the subsequent explanations) is connected to the main word line MWLB0 on the dielectric isolation region, as shown in FIG. 9A. The n+ diffusion layers 16a and 16b positioned at both sides of the gate electrode pattern G1 within the diffusion region K1 are connected to the potential VKK and the sub-word line SWL1, respectively, as shown in FIG. 9A. Therefore, the gate electrode pattern G1 and the n+ diffusion layers 16a and 16b function as the transistor Q4. The gate electrode pattern G1, the n+ diffusion layer 16a, and the n+ diffusion layer 16b constitute a gate, a source, and a drain of the transistor Q4, respectively.

Further, the n+ diffusion layers 17a and 17b positioned at both sides of the gate electrode pattern G1 within the diffusion region K2 are connected to the potential VKK and the sub-word line SWL0, respectively, as shown in FIG. 9A. Therefore, the gate electrode pattern G1 and the n+ diffusion layers 17a and 17b function as the transistor Q1. The gate electrode pattern G1, the n+ diffusion layer 17a, and the n+ diffusion layer 17b constitute a gate, a source, and a drain of the transistor Q1, respectively.

Next, the gate electrode pattern G4 is connected to the main word line MWLB1 on the dielectric isolation region, as shown in FIG. 9A. The n+ diffusion layers 16d and 16e positioned at both sides of the gate electrode pattern G4 within the diffusion region K1 are connected to the sub-word line SWL3 and the potential VKK, respectively, as shown in FIG. 9A. Therefore, the gate electrode pattern G4 and the n+ diffusion layers 16d and 16e function as the transistor Q10. The gate electrode pattern G4, the n+ diffusion layer 16d, and the n+ diffusion layer 16e constitute a gate, a drain, and a source of the transistor Q10, respectively.

The n+ diffusion layers 17d and 17e positioned at both sides of the gate electrode pattern G4 within the diffusion region K2 are connected to the sub-word line SWL2 and the potential VKK, respectively, as shown in FIG. 9A. Therefore, the gate electrode pattern G4 and the n+ diffusion layers 17d and 17e function as the transistor Q7. The gate electrode pattern G4, the n+ diffusion layer 17d, and the n+ diffusion layer 17e constitute a gate, a drain, and a source of the transistor Q7, respectively.

Next, the gate electrode pattern G2 is connected to the word-line float-prevention signal line ARFXB1 on the dielectric isolation region, as shown in FIG. 9A. One straight line portion at the gate electrode pattern G1 side out of two straight line portions extended to the X direction of the gate electrode pattern G2 is focused here. The n+ diffusion layers 16b and 16c are arranged at both sides of this one straight line portion, as shown in FIG. 8A. The n+ diffusion layer 16b constitutes the drain of the transistor Q4 as described above, and the n+ diffusion layer 16c is connected to the potential VKK as shown in FIG. 9A. Therefore, one straight line portion of the gate electrode pattern G2 and the n+ diffusion layers 16b and 16c function as the transistor Q5. The gate electrode pattern G2, the n+ diffusion layer 16b, and the n+ diffusion layer 16c constitute a gate, a drain, and a source of the transistor Q5, respectively.

The other straight line portion of the gate electrode pattern G2 (one straight line portion at the gate electrode pattern G4 side out of the two straight line portions extended to the X direction of the gate electrode pattern G2) is focused below. The n+ diffusion layers 16c and 16d are arranged at both sides of the other straight line portion, as shown in FIG. 8A. The n+ diffusion layer 16c is connected to the potential VKK as described above, and the n+ diffusion layer 16d constitutes the drain of the transistor Q10 as described above. Therefore, the other straight line portion of the gate electrode pattern G2 and the n+ diffusion layers 16c and 16d function as the transistor Q11. The gate electrode pattern G2, the n+ diffusion layer 16c, and the n+ diffusion layer 16d constitute a gate, a source, and a drain of the transistor Q11, respectively.

As described above, the active region K1 has the cut C1 (see FIG. 7) immediately below the gate electrode pattern G2. Therefore, channel regions of the transistors Q5 and Q11 are effectively very narrow. Although a driving capacity of the transistor Q5 becomes smaller than that when the cut C1 is not provided, the driving capacity is set small by considering a balance of driving capacities, because the driving capacity of the transistors Q5 and Q11 can be small as described above.

The gate electrode pattern G3 is connected to the word-line float-prevention signal line ARFXB0 on the dielectric isolation region, as shown in FIG. 9A. One straight line portion at the gate electrode pattern G1 side out of two straight line portions extended to the X direction of the gate electrode pattern G3 is focused here. The n+ diffusion layers 17b and 17c are arranged at both sides of this one straight line portion, as shown in FIG. 8A. The n+ diffusion layer 17b constitutes the drain of the transistor Q1 as described above, and the n+ diffusion layer 17c is connected to the potential VKK as shown in FIG. 9A. Therefore, one straight line portion of the gate electrode pattern G3 and the n+ diffusion layers 17b and 17c function as the transistor Q2. The gate electrode pattern G3, the n+ diffusion layer 17b, and the n+ diffusion layer 17c constitute a gate, a drain, and a source of the transistor Q2, respectively.

The other straight line portion of the gate electrode pattern G3 (one straight line portion at the gate electrode pattern G4 side out of the two straight line portions extended to the X direction of the gate electrode pattern G3) is focused below. The n+ diffusion layers 17c and 17d are arranged at both sides of the other straight line portion, as shown in FIG. 8A. The n+ diffusion layer 17c is connected to the potential VKK as described above, and the n+ diffusion layer 17d constitutes the drain of the transistor Q7 as described above. Therefore, the other straight line portion of the gate electrode pattern G3 and the n+ diffusion layers 17c and 17d function as the transistor Q8. The gate electrode pattern G3, the n+ diffusion layer 17c, and the n+ diffusion layer 17d constitute a gate, a source, and a drain of the transistor Q8, respectively.

Next, the active regions K3 and K4 are mainly explained. The gate electrode pattern G5 is connected to the main word line MWLB0 on the dielectric isolation region, as shown in FIG. 9A. Both the p+ diffusion layers 18a and 18c positioned at both sides of the gate electrode pattern G5 within the diffusion region K3 are connected to the sub-word-line select signal line AAFXT1, as shown in FIG. 9A. Further, the p+ diffusion layer 18b positioned in the gate electrode pattern G5 within the diffusion region K3 is connected to the sub-word line SWL1, as shown in FIG. 9A. Therefore, the gate electrode pattern G5 and the p+ diffusion layers 18a to 18c function as the transistor Q3. The gate electrode pattern G5, the p+ diffusion layers 18a and 18c, and the p+ diffusion layer 18b constitute a gate, a source, and a drain of the transistor Q3, respectively.

The p+ diffusion layers 19a and 19c positioned at both sides of the gate electrode pattern G5 within the diffusion region K4 are connected to the sub-word-line select signal line AAFXT0, as shown in FIG. 9A. Further, the p+ diffusion layer 19b positioned in the gate electrode pattern G5 within the diffusion region K4 is connected to the sub-word line SWL0, as shown in FIG. 9A. Therefore, the gate electrode pattern G5 and the p+ diffusion layers 19a to 19c function as the transistor Q0. The gate electrode pattern G5, the p+ diffusion layers 19a and 19c, and the p+ diffusion layer 19b constitute a gate, a source, and a drain of the transistor Q0, respectively.

The gate electrode pattern G6 is connected to the main word line MWLB1 on the dielectric isolation region, as shown in FIG. 9A. Both the p+ diffusion layers 18c and 18e positioned at both sides of the gate electrode pattern G6 within the diffusion region K3 are connected to the sub-word-line select signal line AAFXT1, as shown in FIG. 9A. Further, the p+ diffusion layer 18d positioned in the gate electrode pattern G6 within the diffusion region K3 is connected to the sub-word line SWL3, as shown in FIG. 9A. Therefore, the gate electrode pattern G6 and the p+ diffusion layers 18a to 18c function as the transistor Q6. The gate electrode pattern G6, the p+ diffusion layers 18a and 18c, and the p+ diffusion layer 18b constitute a gate, a source, and a drain of the transistor Q9, respectively.

The p+ diffusion layers 19c and 19e positioned at both sides of the gate electrode pattern G6 within the diffusion region K4 are connected to the sub-word-line select signal line AAFXT0, as shown in FIG. 9A. Further, the p+ diffusion layer 19d positioned in the gate electrode pattern G6 within the diffusion region K4 is connected to the sub-word line SWL2, as shown in FIG. 9A. Therefore, the gate electrode pattern G6 and the p+ diffusion layers 19a to 19c function as the transistor Q6. The gate electrode pattern G6, the p+ diffusion layers 19a and 19c, and the p+ diffusion layer 19b constitute a gate, a source, and a drain of the transistor Q6, respectively.

As shown in FIGS. 8A and 9A, in the transistors Q0, Q3, Q6, and Q9 as P-channel MOS transistors, a gate electrode length is about two times that in the transistors Q1, Q4, Q7, and Q10 as N-channel MOS transistors. This is to compensate for a difference between the driving capacity of the P-channel MOS transistors and the driving capacity of the N-channel MOS transistors, thereby taking a balance between the transistors.

Relationships between the transistors Q1 to Q12, the gate electrode patterns (gate electrode structures) G1 to G6, the n+ diffusion layers, and the p+ diffusion layers are as explained above. A plane pattern layout of the sub-word area SWD is explained next in detail.

Figure 10:
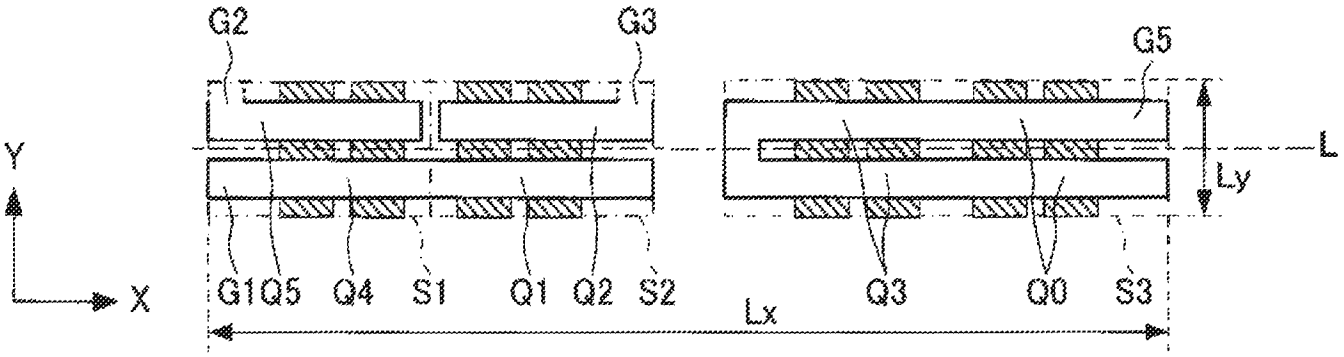
FIG. 10 shows the gate electrode pattern relevant to the main word line and surrounded diffusion layers of gate electrodes extracted from the plane layout pattern shown in FIG. 8A.

FIG. 10 shows the gate electrode pattern relevant to the main word line MWLB0 and surrounded diffusion layers of gate electrodes extracted from the plane layout pattern shown in FIG. 8A. As shown in FIG. 10, when only the main word line MWLB0 is focused, two sub-word line drivers SWLD0 and SWLD1 connected to the main word line MWLB0 include a pair of gate electrode patterns line-symmetric to a straight line L, respectively, and are configured by three gate-electrode pattern sets S1 to S3 arranged in the X direction. The pair of gate electrode patterns are arranged in the X direction, and are arranged in parallel in the Y direction.

As explained above, the two sub-word line drivers SWLD0 and SWLD1 connected to the main word line MWLB0 are arranged within the region slender in the X direction. When a pitch of the sub-word lines is P (=2F; F is a minimum process dimension), a length Ly of this region in the Y direction becomes equal to or smaller than 6P (=12F), as can be understood from FIG. 9. This relationship of Ly≤6P is set because many sub-word line drivers SWLD need to be arranged in parallel within the sub-word area SWD. This relationship is explained in more detail. The length Ly in the Y direction permitted to the two sub-word line drivers SWLD connected to one main word line MWLB is limited to a length corresponding to the entire pitch of four sub-word lines and two dummy sub-word lines DSWL, as can be understood from FIG. 2. On the other hand, there is no such a limitation to a length Lx in the X direction. But the length Lx in the X direction in the present embodiment is shorter than that according to the conventional technique.

A difference between the present embodiment and the conventional technique is explained below with reference to a comparative example achieved by the conventional technique. In the comparative example described below, an internal circuit configuration of the sub-word area SWD is the same as that of the embodiment explained with reference to FIGS. 5 and 6. A driving capacity (=channel width of each transistor) of each transistor is also substantially the same as that of the present embodiment.

Figure 8B:
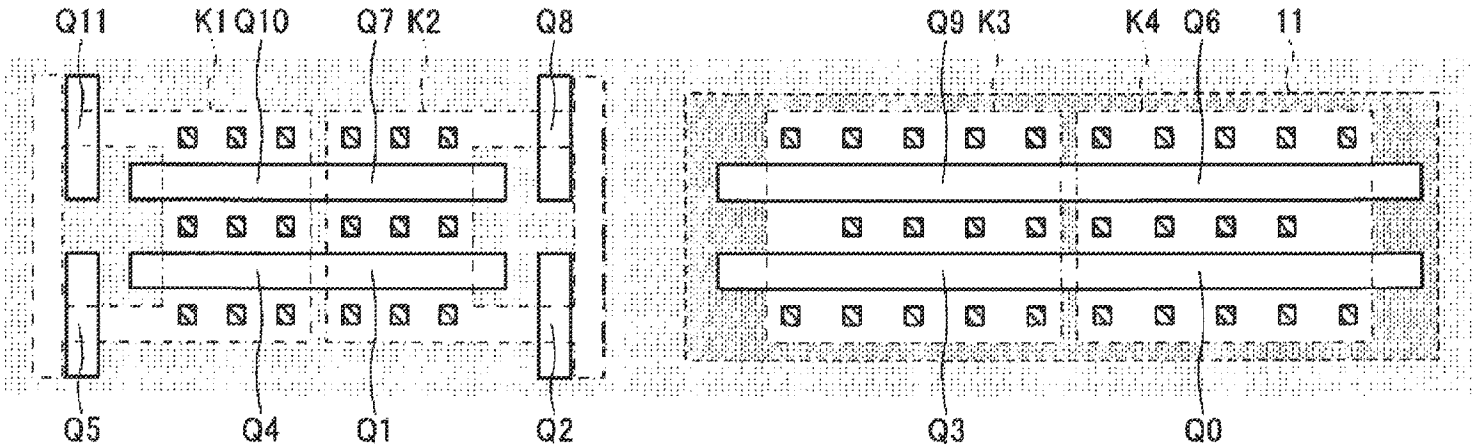
FIG. 8B shows a plane pattern layout of the sub-word area according to a comparative example.
Figure 9B:
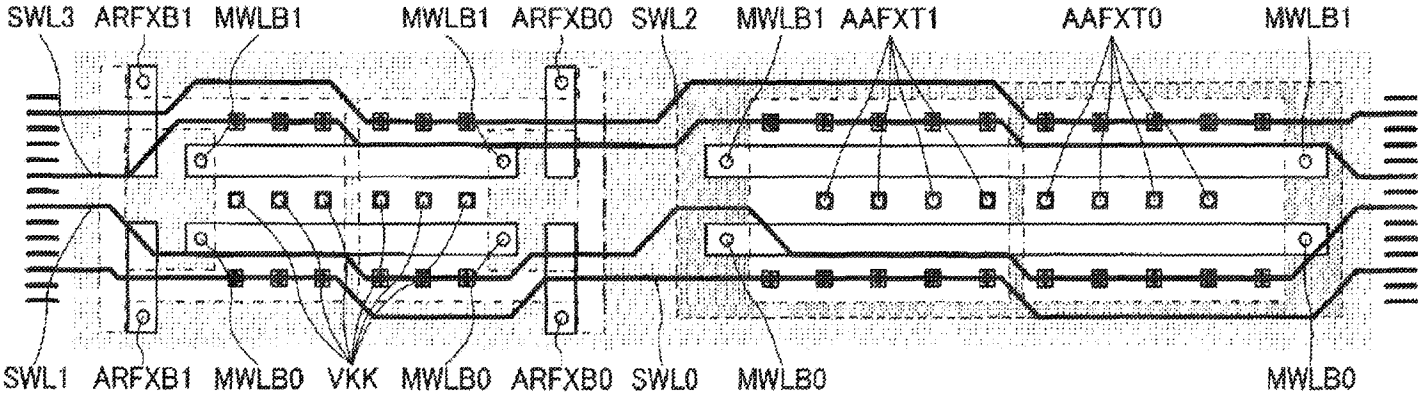
FIG. 9B shows a wiring layout of the sub-word lines connected to the sub-word line drivers, on the plane pattern layout of the sub-word area shown in FIG. 8B.

FIG. 8B shows a plane pattern layout of the sub-word area SWD according to the comparative example. FIG. 9B shows a wiring layout of the sub-word lines SWL0 to SWL3 connected to the sub-word line drivers SWLD0 to SWLD3, on the plane pattern layout of the sub-word area SWD shown in FIG. 8B.

As shown in FIGS. 9A and 9B, a length in the Y direction of a region occupied by the sub-word line drivers SWLD0 to SWLD3 is restricted to 12 sub-word lines (=24F), in both the present embodiment and the comparative example.

Meanwhile, a length in the X direction of the region occupied by the sub-word line drivers SWLD0 to SWLD3 in the comparative example is larger than the length in the present embodiment. As is clear from the comparison between FIGS. 9A and 9B, this difference occurs because while four gate electrode patterns are arranged in parallel in the range of a length of 24F in the Y direction in the present embodiment, only two gate electrode patterns can be arranged in parallel in the same range in the comparative example.

That is, according to the semiconductor memory device of the present embodiment, four gate electrode patterns can be arranged in parallel in the range of the length of 24F in the Y direction. Therefore, the semiconductor memory device according to the present embodiment can further shorten the length Lx in the X direction of the region occupied by the sub-word line drivers SWLD0 to SWLD3 without degrading the performance of the sub-word line driver SWLD. The gate electrode patterns can be arranged in this way because a SAC line technique is used to form contact plugs that connect diffusion layers and upper-layer wirings. Formation of contact plugs by the SAC line technique is explained below while explaining a manufacturing process of the sub-word line driver SWLD.

Figure 11:
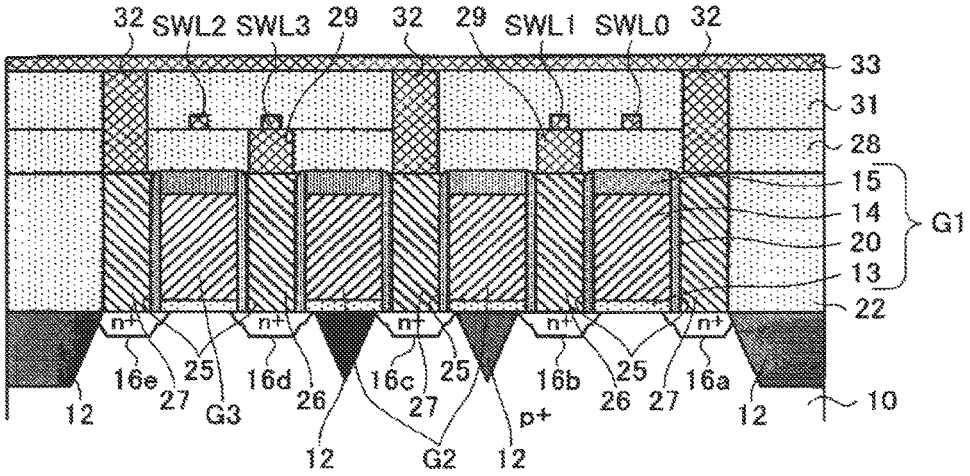
FIG. 11 is a cross-sectional view along a line B-B' in FIG. 8A.

A cross-sectional view of the sub-word line driver SWLD in a completed state is explained first. FIG. 11 is a cross-sectional view along a line B-B' in FIG. 8A. As shown in FIG. 11, an insulation layer 12 is embedded in a surface of a P-type semiconductor layer 10, and a dielectric isolation region is formed by the insulation layer 12. A surface having no insulation layer 12 becomes an active region. It is preferable that the insulation layer 12 is configured by a silicon oxide film.

As shown in FIG. 11, each of the gate electrode structures G1 to G3 (also the gate electrode structures G4 to G6) is configured by a laminate of a gate dielectric film 13 and a gate electrode 14, a cap dielectric film 15 provided on an upper surface of the laminate, and a sidewall dielectric film 20 provided on a side surface of the laminate. It is preferable that polysilicon, a metal, or silicide, or a laminate of these materials is used as a material of the gate electrode 14. Also, it is preferable to use silicon oxide for the gate dielectric film 13. The cap dielectric film 15 and the sidewall dielectric film 20 are provided to dielectrically isolate each adjacent layer from the gate electrode 14. A silicon nitride film can be used for a material of these films.

An interlayer dielectric film 22 is formed in about the same film thickness as that of the gate electrode structures G1 to G3. Contact holes 25 shown in FIG. 11 are provided in the interlayer dielectric film 22. Conductive contact plugs 26 and 27 are embedded in the contact holes 25. The contact plugs 26 are drain contact plugs provided on a diffusion layer constituting a drain region, and the contact plugs 27 are source contact plugs provided on diffusion layers constituting a source region. It is preferable that a polysilicon conductor and a metal such as tungsten are used for materials of the contact plugs 26 and 27.

Diffusion layers (n+ diffusion layers 16b and 16d in FIG. 11) constituting a drain region are connected to corresponding sub-word lines SWL, by drain contact plugs 26 and word contact plugs 29 provided on an upper surface of the drain contact plugs 26. On the other hand, diffusion layers (n+ diffusion layers 16a, 16c, and 16e in FIG. 11) constituting a source region are connected to a ground plane 33 (transistors Q1, Q2, Q4, Q5, Q7, Q8, Q10, and Q11) having the potential VKK or the sub-word-line select signal line AAFXT (transistors Q0, Q3, Q6, and Q9), by the source contact plugs 27 and contact plugs 32 provided on an upper surface of the source contact plugs 27.

A manufacturing process of the sub-word line driver SWLD is explained below with reference to FIGS. 12 to 18.

Figure 15:
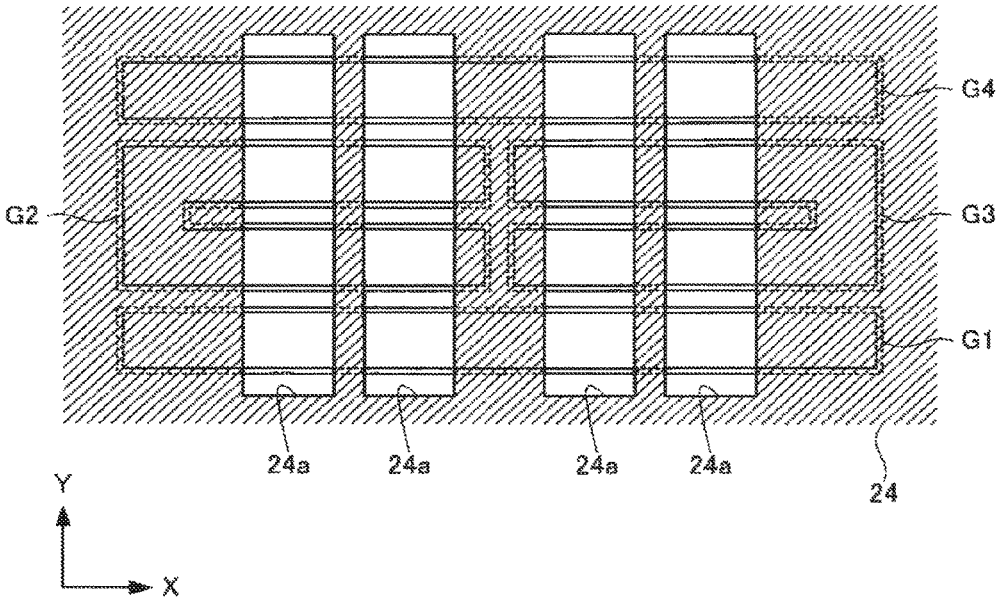
FIG. 15 is a plan view of a part of the sub-word line driver and shows a manufacturing processes of the sub-word line driver and peripheral wirings thereof.
Figure 16:
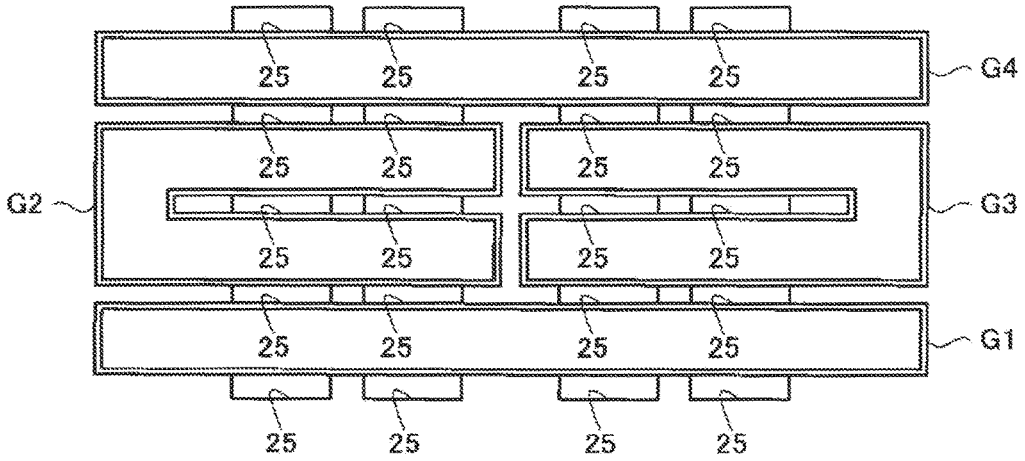
FIG. 16 is a plan view of a part of the sub-word line driver and shows a manufacturing processes of the sub-word line driver and peripheral wirings thereof.
Figure 17:
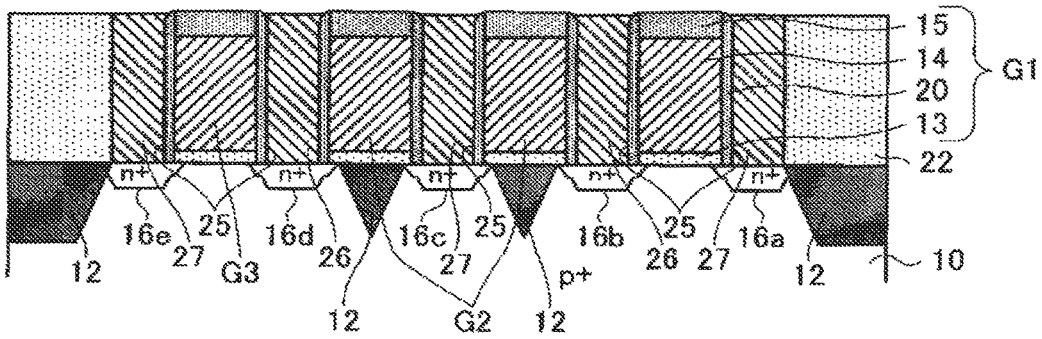
FIG. 17 is a plan view of a part of the sub-word line driver and shows a manufacturing processes of the sub-word line driver and peripheral wirings thereof.

FIGS. 12 to 14 and FIG. 18 are cross-sectional views along the line B-B' in FIG. 8A. FIGS. 15 to 17 are plan views near the gate electrode structures G1 to G4 in FIG. 8A. These drawings show manufacturing processes of the sub-word line driver SWLD and peripheral wirings thereof. A manufacturing process of portions of the transistors Q4, Q5, Q11, and Q10 is explained below with reference to these drawings and FIGS. 7 to 9.

Figure 12:
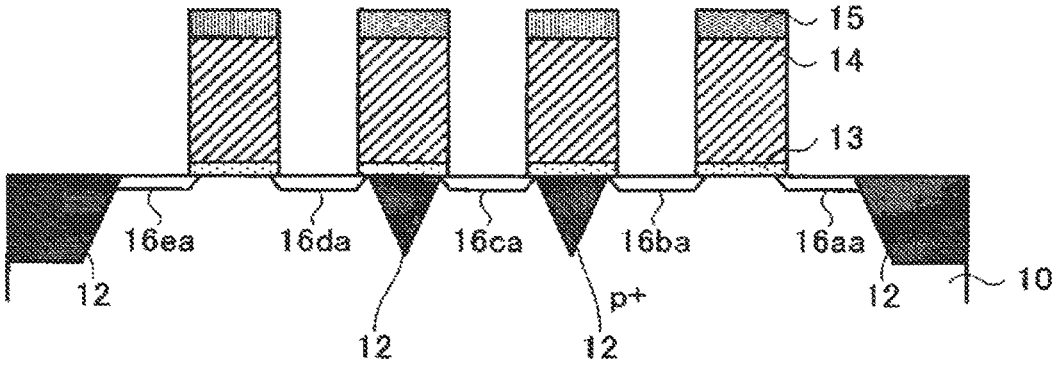
FIG. 12 is a cross-sectional view along a line B-B' in FIG. 8A and shows a manufacturing processes of the sub-word line driver and peripheral wirings thereof.

First, a semiconductor substrate having the P-type semiconductor layer 10 is prepared. As shown in FIG. 7, impurity is implanted into a region in which a P-channel MOS transistor is to be formed, and the N-type region 11 is provided. As shown in FIG. 12, a dielectric isolation region (the insulation layer 12) is provided to partition the active region K.

Next, as shown in FIG. 12, a silicon surface of the P-type semiconductor layer 10 is oxidized by using a thermal oxidation method, thereby forming an insulation film of silicon oxide having a film thickness of about 5 nm. A conductive material of polysilicon or the like is laminated in a thickness of about 100 nm on this insulation film. A silicon nitride film is formed in a film thickness of about 200 nm on an upper surface of this laminated film. These films are patterned in a shape as shown in FIGS. 7 to 9 by anisotropic etching using a mask pattern. By the above process, as shown in FIG. 12, plural laminates of the gate dielectric film 13, the gate electrode 14, and the cap dielectric film 15 are formed on the semiconductor layer 10.

After the patterning is completed, n− diffusion layers 16aa to 16ea are formed on an exposed surface of the P-type semiconductor layer 10, as shown in FIG. 12. Impurity concentration of the n− diffusion layers 16aa to 16ea formed at this stage is relatively low.

Figure 13:
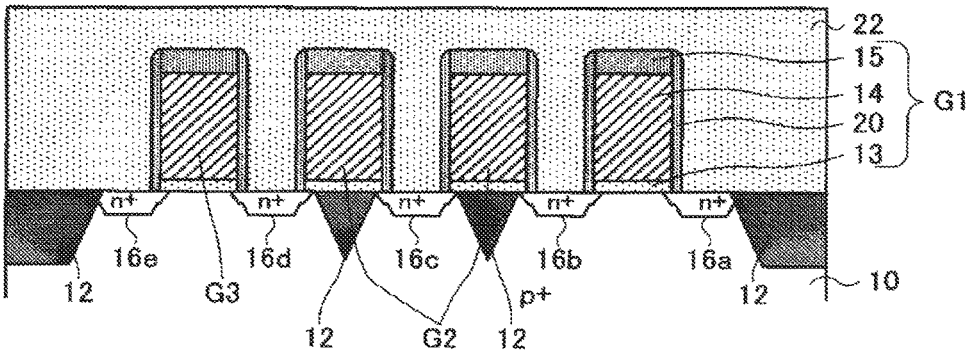
FIG. 13 is a cross-sectional view along a line B-B' in FIG. 8A and shows a manufacturing processes of the sub-word line driver and peripheral wirings thereof.

Next, a silicon nitride film is deposited on the entire surface by the CVD method, and this film is etched back, thereby forming the sidewall dielectric film 20 in a film thickness of about 20 nm on a side surface of the gate dielectric film 13, the gate electrode 14, and the cap dielectric film 15, respectively, as shown in FIG. 13. Plural gate electrode structures, each having its front surface and side surface covered by the insulation film, are formed above.

After the gate electrode structure is formed, an impurity ion is implanted again, thereby forming the n+ diffusion layers 16a to 16e on the exposed surface of the P-type semiconductor layer, as shown in FIG. 13. Impurity concentration of the n+ diffusion layers 16a to 16e formed at this stage is relatively high. Before implanting the ion to form the n+ diffusion layers 16a to 16e, a selective epitaxial layer can be formed by selectively epitaxially growing silicon on the n-diffusion layers 16aa to 16ea. The n+ diffusion layers 16a to 16e are formed by diffusing impurity via the selective epitaxial layer in this way.

After forming the n+ diffusion layers 16a to 16e, a silicon oxide film is deposited in a film thickness of about 500 nm on the entire surface, thereby forming the insulation layer 22 shown in FIG. 13. The surface of the insulation layer 22 is flattened by using the CMP method or the like.

Figure 14:
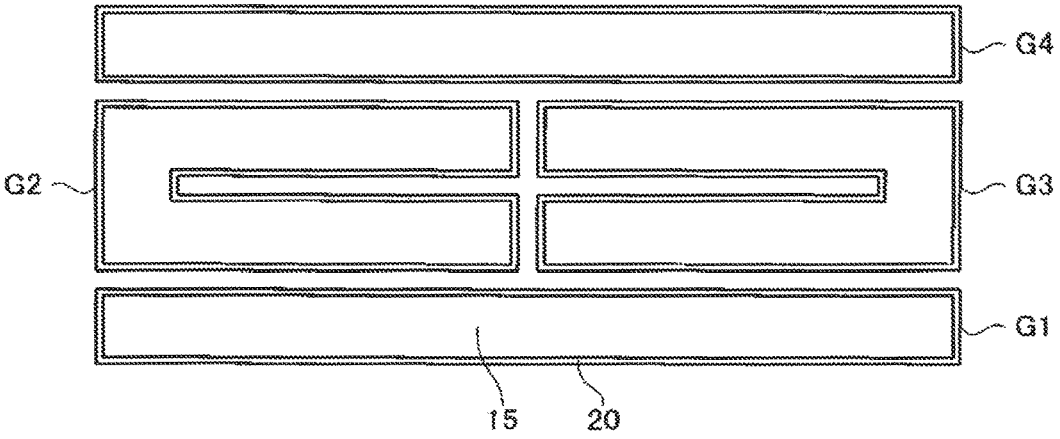
FIG. 14 is a cross-sectional view along a line B-B' in FIG. 8A and shows a manufacturing processes of the sub-word line driver and peripheral wirings thereof.

FIG. 14 is a plan view of a transistor in a state that processing up to the process shown in FIG. 13 is completed. FIG. 14 omits the insulation layer 22. As shown in FIG. 14, the gate electrode structures G1 to G4 in a rectangular shape or a U shape are completed.

Next, as shown in FIG. 15, a mask layer 24 is formed on the insulation layer 22. A so-called a hard mask is used for the mask layer 24. The mask layer 24 has line-shaped openings 24a provided across portions in which contact plugs of transistors are to be formed. That is, as shown in FIG. 11, the contact plugs 26 and 27 are formed on the diffusion layers. The openings 24a are provided along the Y direction across these contact plugs.

The insulation layer 22 is selectively removed by selective etching using the mask layer 24 as a mask. That is, as described above, the cap dielectric film 15 and the sidewall dielectric film 20 are made of a silicon nitride film. On the other hand the insulation layer 22 is a silicon oxide film. When a gas of a CF system is used as etchant, an etching rate of the silicon oxide film is larger than that of the silicon nitride film. Therefore, only the insulation layer 22 can be selectively removed. Contact holes in a direction perpendicular to a paper surface are partitioned by the insulation film 22.

The mask layer 24 has the openings 24a having a line shape provided across the plural contact plugs as described above. The openings are provided based on the SAC line technique. As compared with a case of providing openings for each contact plug (the SAC hole technique), etchant can efficiently move within the contact holes. Therefore, etching can be performed efficiently. Consequently, time required for etching can be relatively short, and the cap dielectric film 15 and the sidewall dielectric film 20 can be formed relatively thin. The cap dielectric film 15 and the sidewall dielectric film 20 can have a thickness of about 20 nm as described above. On the other hand, when the SAC hole technique is used, a thickness of about 30 nm is necessary.

After the selective etching is finished, the contact holes 25 are formed on the n+ diffusion layers, as shown in FIG. 16, thereby exposing the n+ diffusion layers. In case a selective epitaxial layer is formed, the epitaxial layer is exposed. In this state, a conductive layer of polysilicon or a laminated film of TiN (titanium nitride) and W (tungsten) or the like is deposited in a thickness of about 100 nm on the entire surface, and a deposited result is polished by CMP until when a surface of the gate electrode structure is exposed. As a result, the contact plugs 26 and 27 are formed within each contact hole 25, as shown in FIG. 17.

Figure 18:
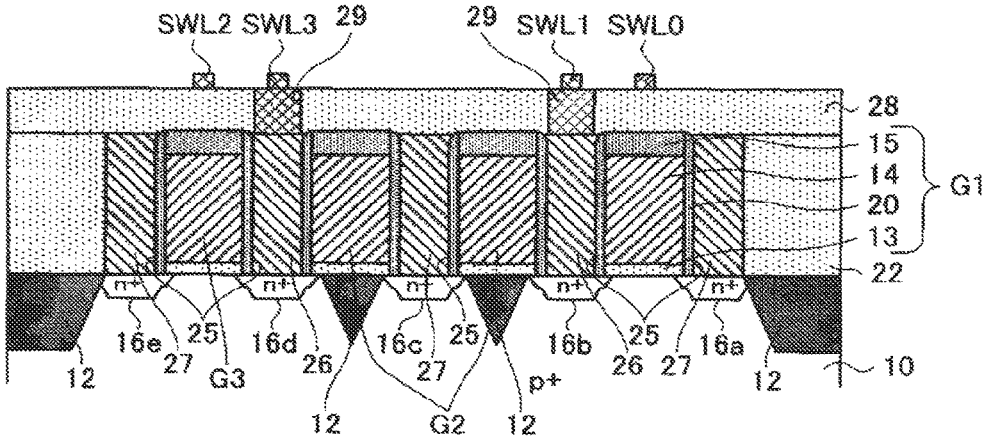
FIG. 18 is a cross-sectional view along a line B-B' in FIG. 8A and shows a manufacturing processes of the sub-word line driver and peripheral wirings thereof.

An interlayer dielectric film. 28 made of a silicon oxide film or the like is formed in a thickness of about 200 nm on the entire surface, and the interlayer dielectric film 28 is partly etched to expose the contact plugs 26, thereby forming the word contact plugs 29 in contact with the contact plugs 26, as shown in FIG. 18. Although not shown, at this stage, gate contact plugs to connect the gate electrodes to wirings on in an upper layer are also formed. The sub-word lines SWL are formed on the interlayer dielectric film 28.

As shown in FIG. 11, an interlayer dielectric film 31 that covers the interlayer dielectric film 28 and the sub-word lines SWL is formed. Holes piercing through the interlayer dielectric films 28 and 31 are provided, and the contact plugs 32 are formed in the holes. Finally, the ground plane 33 is formed on the interlayer dielectric film 31.

As explained above, in the manufacturing method of the semiconductor memory device according to the present embodiment, the openings 24a of the mask layer 24 are provided in a line shape across the contact plugs 26 and 27. Therefore, as compared with the case of using the SAC hole technique, etchant can efficiently move within the contact holes. Accordingly, time required for etching can be relatively short, and the cap dielectric film 15 and the sidewall dielectric film 20 can be formed relatively thin. Consequently, a distance between the contact plugs 26 and 27 and the gate electrodes 14 can be shortened. As a result, in the semiconductor memory device according to the present embodiment, the entire DRAM can be downscaled, that is, the chip area is downsized. Specifically, a length in the X direction of the sub-word line driver SWLD can be reduced from a length according to the conventional technique.

It is apparent that the present invention is not limited to the above embodiments, but may be modified and changed without departing from the scope and spirit of the invention.

The present invention is particularly suitable for application to a select-line driving circuit that drives select lines. Examples of select lines are column select lines and main word lines, in addition to sub-word lines. As a modification of the above embodiment, application of the present invention to the column decoder YDEC as a select-line driving circuit that drives column select lines is explained.

Figure 19:
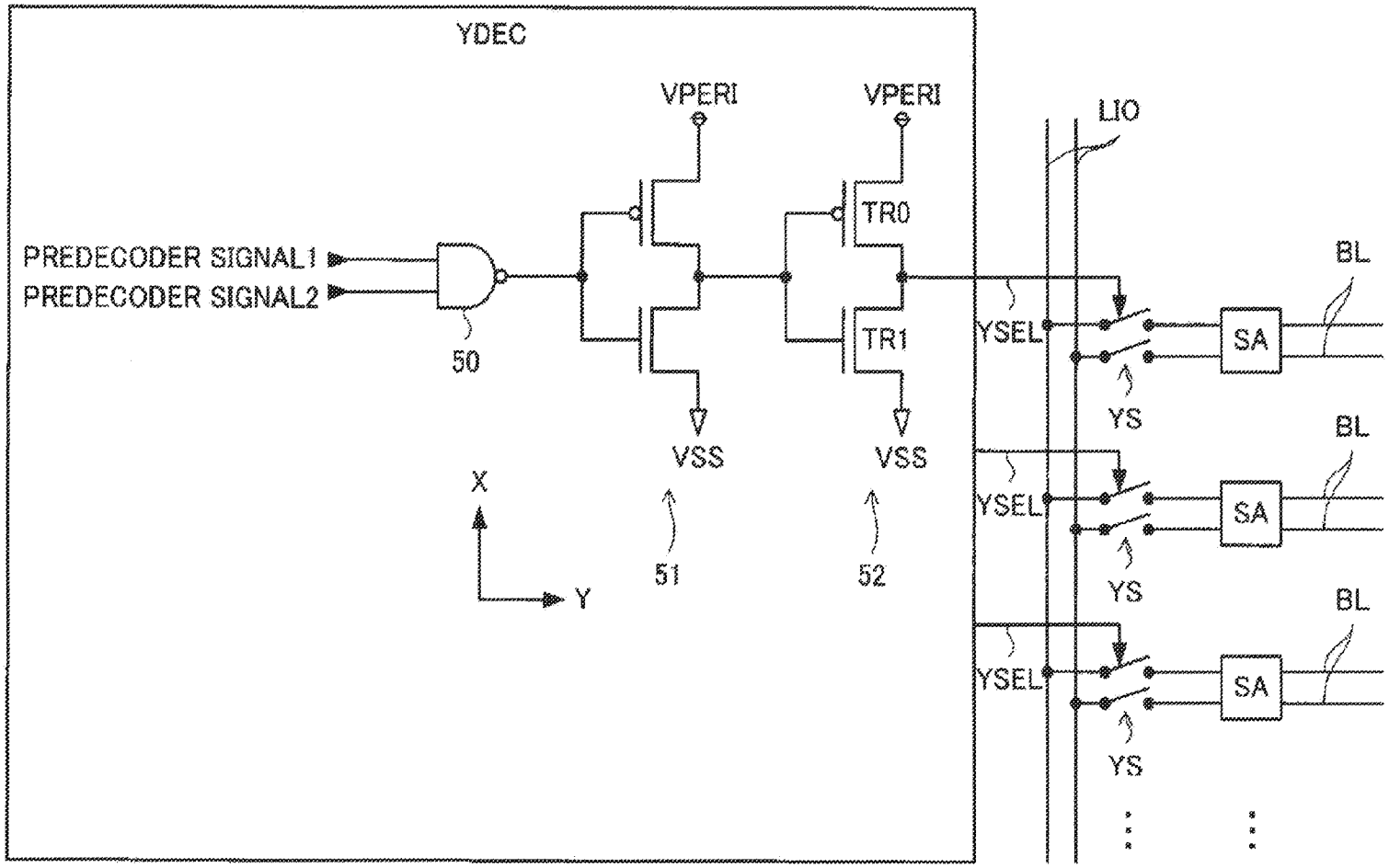
FIG. 19 shows a circuit configuration of the column decoder according to a modification of an embodiment of the present invention.

FIG. 19 shows a circuit configuration of the column decoder YDEC. As shown in FIG. 19, the column decoder YDEC is connected to many column switches YS.

The column switch YS is a switch circuit provided for each sense amplifier SA, and making and breaking a connection between the sense amplifier SA and a local I/O (LIO). Because the column switch YS is provided for each sense amplifier SA, many column switches YS are arranged in the X direction in a similar manner to that of the sense amplifiers SA.

A NAND circuit 50 and inverter circuits 51 and 52 are arranged in series at a final stage of the column decoder YDEC. The inverter circuit 52 drives a column select signal based on a predecoder signal input from a predecoder circuit (not shown) via the NAND circuit 50 and the inverter circuit 51, and is provided for each column switch YS. Therefore, many inverter circuits 52 are also arranged in the X direction in a similar manner to that of the sense amplifiers SA. A length of the inverter circuits 52 in the X direction is limited to a predetermined number times a pitch of the bit lines BL. A length in the Y direction of the inverter circuit 52 configured by using the present invention can be shortened even in this limitation. This configuration is explained in detail below.

Figure 20A:
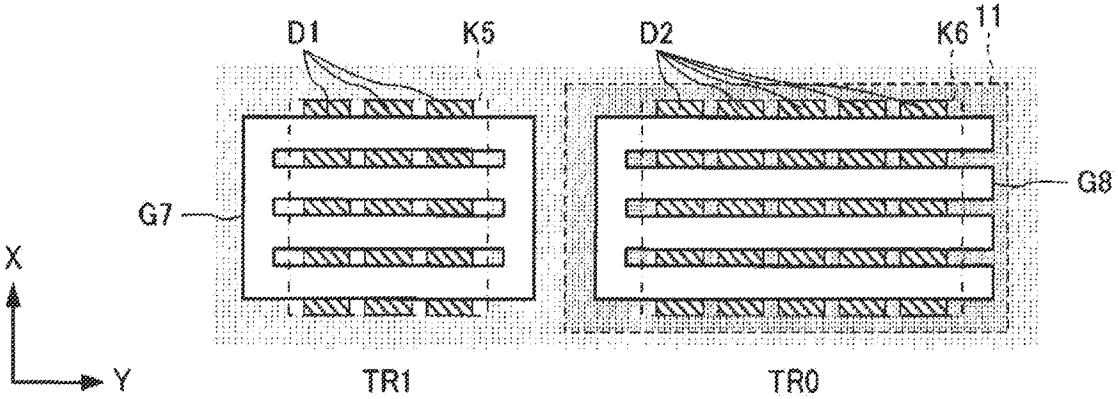
FIG. 20A shows a plane pattern layout of the inverter circuit configured by using the present invention.
Figure 20B:
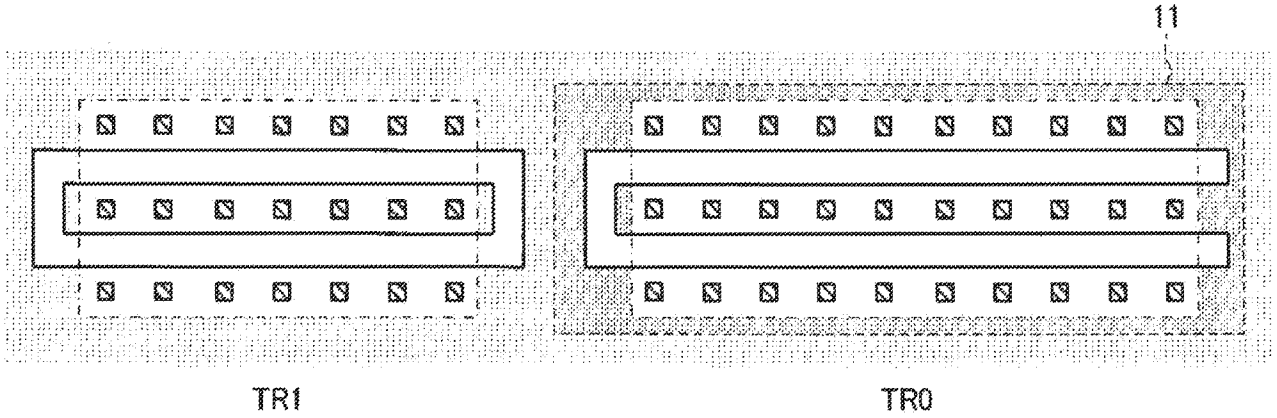
FIG. 20B shows a plane pattern layout of a similar inverter circuit configured without using the present invention.

FIG. 20A shows a plane pattern layout of the inverter circuit 52 configured by using the present invention. FIG. 20B shows a plane pattern layout of a similar inverter circuit configured without using the present invention. FIGS. 20A and 20B show a P-channel MOS transistor TR0 and an N-channel MOS transistor TR1 constituting the inverter circuit 52, respectively in a similar manner to that shown in FIG. 8 explained in the above embodiment.

Figure 21A:
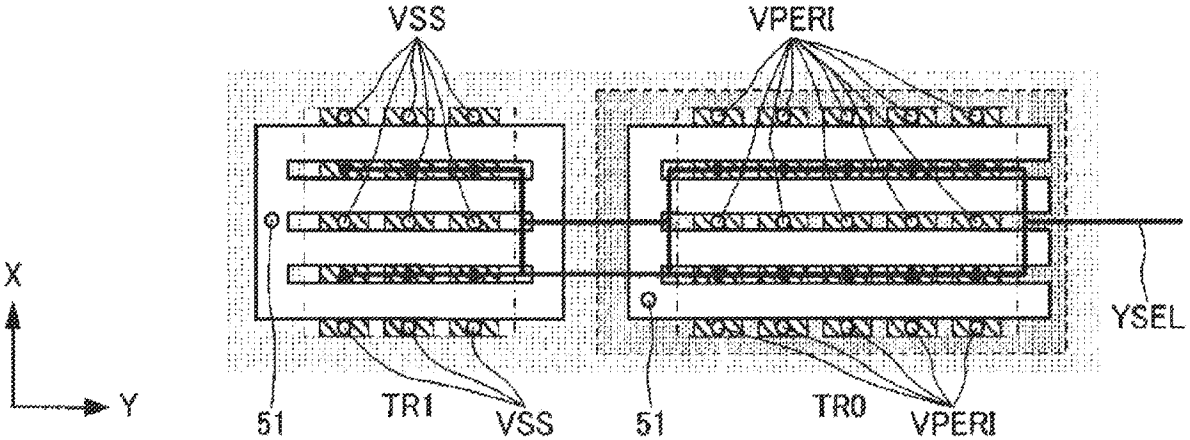
FIGS. 21A and 21B show wiring layouts of a column select signal line connected to the inverter circuits shown in FIGS. 20A and 20B, on the plane pattern layouts of the inverter circuits, respectively.
Figure 21B:
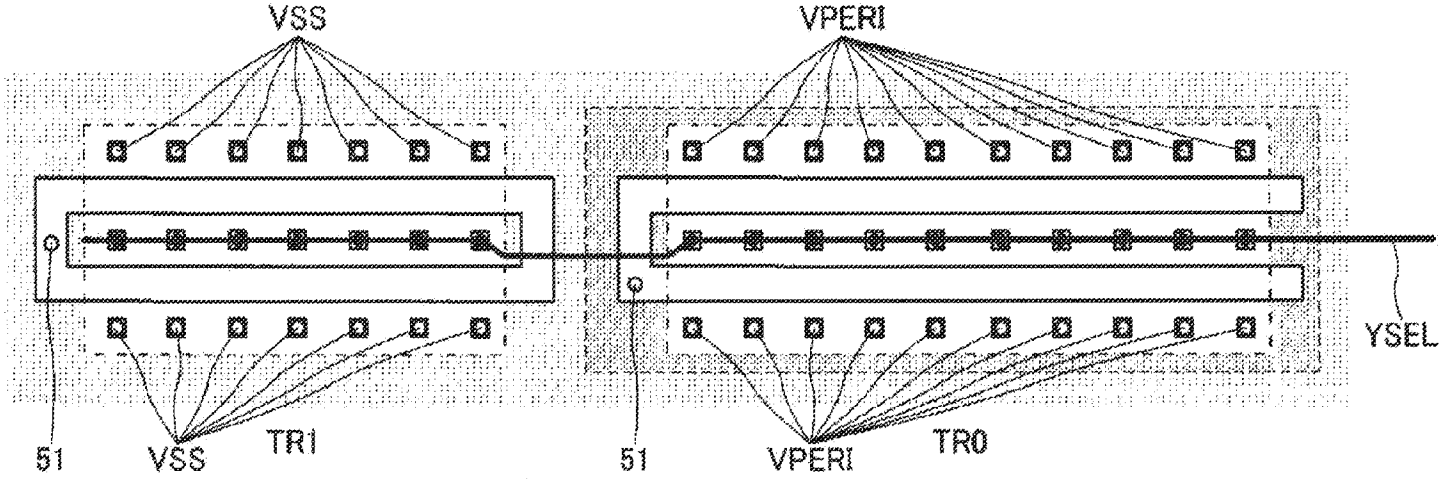

FIGS. 21A and 21B show wiring layouts of a column select signal line YSEL connected to the inverter circuits shown in FIGS. 20A and 20B, on the plane pattern layouts of the inverter circuits, respectively. Reference symbols in FIGS. 21A and 21B designate like parts as those in FIG. 9A.

As shown in FIG. 20A, the transistor TR1 is configured by n+ diffusion layers D1 provided on a surface of an active region K5 at outside of the N-type region 11, and a gate electrode structure G7 provided on the surface. The transistor TR0 is configured by p+ diffusion layers D2 provided on a surface of an active region K6 within the N-type region 11, and a gate electrode structure G8 provided on the surface.

The gate electrode structure G7 is connected to an output of the inverter circuit 51, as shown in FIG. 21A. The n+ diffusion layers D1 are connected to the column select signal line YSEL and a potential VSS. With this arrangement, the gate electrode structures G7 and the n+ diffusion layers D1 function as the transistor TR1.

The gate electrode structure G8 is also connected to an output of the inverter circuit 51, as shown in FIG. 21A. The p+ diffusion layers D2 are connected to the column select signal line YSEL and a potential VPERI. With this arrangement, the gate electrode structures G8 and the p+ diffusion layers D2 function as the transistor TR0.

As shown in FIG. 20A, the gate electrode structures (gate electrode patterns) G7 and G8 have four parallel straight line portions extended to the Y direction, respectively, and the four straight line portions are arranged in parallel in the X direction. On the other hand, in a comparative example shown in FIG. 20B, the gate electrode structures (gate electrode patterns) have two parallel straight line portions extended to the Y direction, respectively, and the two straight line portions are arranged in parallel in the X direction. Because of this difference, the inverter circuit 52 configured using the present invention has a shorter length in the Y direction than a direction in the comparative example, despite the same effective channel widths. This is achieved by using the SAC line technique in forming the contact plugs that connect the diffusion layers D1 and D2 and an upper layer wiring, by applying the present invention to the inverter circuit.

As described above, when the present invention is applied to the column decoder YDEC as a circuit that drives the column select lines, a length of the column decoder YDEC in the Y direction can be shortened.

The main word line driver MLD (see FIG. 1) as a circuit that drives the main word line has a CMOS similar to the column decoder YDEC, at a last stage. By applying the present invention to the CMOS, a length of the main word line driver MLD in the X direction can be shortened.

In addition, while not specifically claimed in the claim section, the applicant reserves the right to include in the claim section of the application at any appropriate time the following methods:

AA. A method of a semiconductor device, comprising:

forming in a semiconductor body source and drain regions of a plurality of transistors constituting a select-line driving circuit that drives a select-line in response to selection information;

forming an insulating layer over the semiconductor body including the source and drain regions;

forming on the insulating layer a mask layer including a line-shaped opening such that the line-shaped opening is positioned over respective parts of the source and drain regions of the transistors with an intervention of the insulating layer; and forming a plurality of contact plugs each electrically connected to an associated one of the source and drain regions by use of a line SAC (Self-Align Contact) technique in which of the insulation layer is selectively removed by using the mask.

AA1. The method of the above AA, wherein the select-line is at least one of word and column lines.

AA2. The method of the above AA, wherein the line-shaped opening is provided along a direction substantially orthogonal to the select-line.

BB. A manufacturing method of a semiconductor device, comprising:

forming a plurality of gate structures on an active region in line, each of the gate structures comprising a gate electrode and an insulating film covering the gate electrode, the gate structures being respectively for a plurality of transistors each driving an associated one of word lines or column lines;

forming interlayer insulating layer over the active region the gate structures;

forming a mask layer on the interlayer insulation layer, the mask layer having at least one opening, the opening being elongated to crosses respective portions of the interlayer insulating layer active region in which a plurality of contact holes for source and drain regions of the transistors are to be formed;

selectively removing the interlayer insulation layer by using the mask layer and the insulating film as a mask to form the contact holes; and forming contact plugs in the contact holes.

BB1. The method of the above BB, wherein the opening is provided in a direction substantially orthogonal to the word or column lines.

BB2. The method of the above BB, wherein the gate structures are provided in a direction substantially orthogonal to the word lines.

BB3. The method of the above BB2, wherein the gate structures are provided to form a plurality of rows.

BB4. The method of the above BB, wherein each of the contact holes are formed between associated adjacent two of the gate structures.

What is claimed is:

1. A method comprising:

forming in a semiconductor body source and drain regions of a plurality of transistors constituting a select-line driving circuit that drives a select-line in response to selection information;

forming an insulating layer over the semiconductor body including the source and drain regions;

forming on the insulating layer a mask layer including a line-shaped opening such that the line-shaped opening is positioned over respective parts of the source and drain regions of the transistors with an intervention of the insulating layer; and forming a plurality of contact plugs each electrically connected to an associated one of the source and drain regions by use of a line SAC (Self-Align Contact) technique in which of the insulation layer is selectively removed by using the mask layer.

2. The method as claimed in claim 1, wherein the select-line is at least one of word and column lines.

3. The method as claimed in claim 1, wherein the line-shaped opening is provided along a direction substantially orthogonal to the select-line.

4. A method comprising:

forming a plurality of gate structures on an active region in line, each of the gate structures comprising a gate electrode and an insulating film covering the gate electrode, the gate structures being respectively for a plurality of transistors each driving an associated one of word lines or column lines;

forming interlayer insulating layer over the active region on which the gate structures are formed;

forming a mask layer on the interlayer insulation layer, the mask layer having at least one opening, the opening being elongated to cross respective portions of the gate structures on the active region in which a plurality of contact holes for source and drain region of the transistors are to be formed;

selectively removing the interlayer insulation layer by using the mask layer and the insulating film as a mask to form the contact holes; and forming contact plugs in the contact holes.

5. The method as claimed in claim 4, wherein the opening is provided in a direction substantially orthogonal to the word of column lines.

6. The method as claimed in claim 4, wherein the gate structures are provided in a direction substantially orthogonal to the word lines.

7. The method as claimed in claim 6, wherein the gate structures are provided to form a plurality of rows.

8. The method as claimed in claim 4, wherein each of the contact holes are formed between associated adjacent two of the gate structures.

*9. A method comprising:*

*forming a plurality of gate structures on an active region in line, each of the gate structures comprising a gate electrode and an insulating film covering the gate electrode, the gate structures being respectively for a plurality of transistors, wherein the plurality of transistors are formed in a memory core region;*

*forming interlayer insulating layer over the active region on which the gate structures are formed;*

*forming a mask layer on the interlayer insulation layer, the mask layer having at least one opening, the opening being elongated to cross respective portions of the gate structures on the active region in which a plurality of contact holes for source and drain region of the transistors are to be formed;*

*selectively removing the interlayer insulation layer by using the mask layer and the insulating film as a mask to form the contact holes; and*

*forming contact plugs in the contact holes.*

*10. The method as claimed in claim 9, wherein the plurality of transistors are formed in a sense amplifier area.*

*11. The method as claimed in claim 9, wherein the memory core region includes at least word line driving circuitry, decoding circuitry, sense amplifier circuitry, and a memory cell area.*

*12. The method as claimed in claim 9, wherein each of the contact holes are formed between associated adjacent two of the gate structures.*

* * * * *